(12) United States Patent
Andrei et al.

(10) Patent No.: US 6,992,919 B2
(45) Date of Patent: Jan. 31, 2006

(54) ALL-METAL THREE-DIMENSIONAL CIRCUITS AND MEMORIES

(75) Inventors: Radu Andrei, Monterey, CA (US); Richard Spitzer, Berkeley, CA (US); E. James Torok, Shoreview, MN (US)

(73) Assignee: Integrated Magnetoelectronics Corporation, Berkeley, CA (US)

( * ) Notice: Subject to any disclaimer, the term of this patent is extended or adjusted under 35 U.S.C. 154(b) by 16 days.

(21) Appl. No.: 10/731,732

(22) Filed: Dec. 8, 2003

(65) Prior Publication Data

US 2004/0183198 A1    Sep. 23, 2004

Related U.S. Application Data

(60) Provisional application No. 60/436,103, filed on Dec. 20, 2002.

(51) Int. Cl.
*G11C 11/00*    (2006.01)

(52) U.S. Cl. .................. 365/158; 365/171; 365/173
(58) Field of Classification Search ................ 365/158, 365/171, 173, 63, 55
See application file for complete search history.

(56) References Cited

U.S. PATENT DOCUMENTS

| | | | |
|---|---|---|---|
| 2,911,627 A | 11/1959 | Kilburn et al. |
| 3,972,786 A | 8/1976 | Ballard |
| 4,751,677 A | 6/1988 | Daughton et al. |
| 4,780,848 A | 10/1988 | Daughton et al. |
| 4,829,476 A | 5/1989 | Dupuis et al. |
| 5,051,695 A | 9/1991 | Hunter et al. |
| 5,173,873 A | 12/1992 | Wu et al. |
| 5,251,170 A | 10/1993 | Daughton et al. |
| 5,432,734 A | 7/1995 | Kawano et al. |
| 5,442,508 A | 8/1995 | Smith |
| 5,477,143 A | 12/1995 | Wu |
| 5,477,482 A | 12/1995 | Prinz |
| 5,515,314 A | 5/1996 | Kouhei et al. |
| 5,561,368 A | 10/1996 | Dovek et al. |
| 5,565,236 A | 10/1996 | Gambino et al. |
| 5,585,986 A | 12/1996 | Parkin |
| 5,587,943 A | 12/1996 | Torok et al. |
| 5,640,343 A | 6/1997 | Gallagher et al. |
| 5,640,754 A | 6/1997 | Lazzari et al. |
| 5,650,889 A | 7/1997 | Yamamoto et al. |
| 5,650,958 A | 7/1997 | Gallagher et al. |
| 5,652,445 A | 7/1997 | Johnson |
| 5,654,566 A | 8/1997 | Johnson |

(Continued)

FOREIGN PATENT DOCUMENTS

EP    1 132 917 A2    3/2000

(Continued)

OTHER PUBLICATIONS

Jaquelin K. Spong, et al., "Giant Magnetoresistive Spin Valve Bridge Sensor", Mar. 1996, *IEEE Transactions on Magnetics*, vol. 32, No. 2, pp. 366-371.

(Continued)

*Primary Examiner*—David Lam
(74) *Attorney, Agent, or Firm*—Beyer Weaver & Thomas, LLP

(57) ABSTRACT

A three-dimensional circuit and methods for fabricating such a circuit are described. The three-dimensional circuit includes a plurality of stacked levels on a substrate. Each level includes a plurality of all-metal circuit components exhibiting giant magnetoresistance and arranged in two dimensions, the circuit further includes an interconnect for providing interconnections between the circuit components on different ones of the plurality of levels.

43 Claims, 29 Drawing Sheets

U.S. PATENT DOCUMENTS

| | | | |
|---|---|---|---|
| 5,661,449 | A | 8/1997 | Araki et al. |
| 5,686,837 | A | 11/1997 | Coehoorn et al. |
| 5,793,697 | A | 8/1998 | Scheuerlein |
| 5,852,574 | A | 12/1998 | Naji |
| 5,892,708 | A | 4/1999 | Pohm |
| 5,903,708 | A | 5/1999 | Kano et al. |
| 5,920,500 | A | 7/1999 | Tehrani et al. |
| 5,929,636 | A | 7/1999 | Torok et al. |
| 5,969,978 | A | 10/1999 | Prinz |
| 5,989,406 | A | 11/1999 | Beetz et al. |
| 6,031,273 | A | 2/2000 | Torok et al. |
| 6,055,179 | A * | 4/2000 | Koganei et al. ............ 365/158 |
| 6,104,632 | A * | 8/2000 | Nishimura ................. 365/158 |
| 6,134,138 | A | 10/2000 | Lu et al. |
| 6,166,944 | A | 12/2000 | Ogino |
| 6,169,292 | B1 | 1/2001 | Yamazaki et al. |
| 6,278,594 | B1 | 8/2001 | Engel et al. |
| 6,292,336 | B1 | 9/2001 | Horng et al. |
| 6,483,740 | B1 | 11/2002 | Spitzer et al. |
| 2002/0024842 | A1 | 2/2002 | Spitzer et al. |
| 2002/0037595 | A1 | 3/2002 | Hostani |
| 2003/0214835 | A1 * | 11/2003 | Nejad et al. ................ 365/158 |

FOREIGN PATENT DOCUMENTS

| | | |
|---|---|---|
| WO | WO 97/41601 | 11/1997 |
| WO | WO 02/05268 A2 | 1/2002 |
| WO | WO 02/05470 A2 | 1/2002 |
| WO | WO 02/078100 A1 | 10/2002 |

OTHER PUBLICATIONS

Mark Johnson, "*The All-Metal Spin Transistor*", May 1994, *IEEE Spectrum*, pp. 47-51.

Mark Johnson, "*Bipolar Spin Switch*", Apr. 16, 1996, *Science*, vol. 260, pp. 320-323.

J.M. Daughton, "*Magnetoresistive Memory Technology,*" Jul. 28-Aug. 2, 1991, *Int'l Workshop on Science and Technology of Thin Films for the 21st Century*, vol. 216, pp. 162-168.

K.T.M. Ranmuthu et al., "*New Low Current Memory Modes with Giant Magneto-Resistance Materials*," Apr. 13, 1993, *Digests of International Magnetics Conference*, 2 pages.

J.L. Brown, "*1-Mb Memory Chip Using Giant Magnetoresistive Memory Cells*," Sep. 1994, *IEEE Transactions on Components, Packaging, and Manufacturing Technology*, Part A, vol. 17, No. 3, pp. 373-379.

Torok et al., "*Measurement of the Easy-Axis and Hk Probability Density Functions for Thin Ferromagnetic Films Using the Longitudinal Permeability Hysteresis Loop*", *Journal of Applied Physics*, 33, No. 10, Oct. 1962, pp. 3037-3041.

Lenssen, et al, "*Expectations of MRAM in Comparison With Other Non-Volatile Memory Technologies*", Phillips Research Laboratories, pp. 26-30.

Torok, et al, "*Longitudinal Permeability in Thin Permalloy Films*", *Journal of Applied Physics*, 34, No. 4, (Part 2), Apr. 1963, pp. 1064-1066.

Paul a. Packan, "*Pushing The Limits*", Sep. 24, 1999. science Mag, vol. 285, pp. 2079-2081.

Pratt, W.P., et al., "*Perpendicular Giant Magnetoresistances of Ag/Co Multilayers*", *Physical Review Letters*, 66 (23): 3060-3063 (Jun. 1991).

Parkin, S.S.P, et al., "*Oscillatory Magnetic Exchange Coupling through Thin Copper Layers*", *Physical Review Letters*, 66(16): 2152-2155 (Apr. 1991).

Jones, K., "*Texas Instruments Plans Large Expansion*", *The New York Times* (Aug. 20, 1993).

Callaby, D.R. et al., Solid State Memory Study Final Report, Technical Report No. RE-0013, National Media Lab, St. Paul, MN (Feb. 1994).

National Media Laboratory Spring Review on Solid-State Memory Technologies, Proc. 1994 Spring Conference on Solid-State Memory Technologies, Pasadena, CA, (May 23-25, 1994), pp. 3-8, 97, 121, 123-133.

Harrison, R.W., "*Laser Scanning Surface Profilomete*", *IBM Technical Disclosure Bullentin*, 13(3): 789-790 (Aug. 1970).

Hylton, T.L., et al, "*Giant Magnetoresistance at Low Fields in Discontinuous NiFe-Ag Multilayer Thin Films*", *Science*, 261:1021-1024 (Aug. 1993).

Xiao, et al., "*Giant Magnetoresistance in Nonmultilayer Magnetic Systems*", *Physical Review Letters*, vol. 68, No. 25, Jun. 22, 1992, pp. 3749-3752.

Zhang, S., "*Theory of Giant Magnetoresistance in Magnetic Granular Films*", *Appl. Phys. Lett.*, 61(15): 1855-1857 (Oct. 1992).

International Search Report, Filing Date Sep. 12, 2003.

* cited by examiner

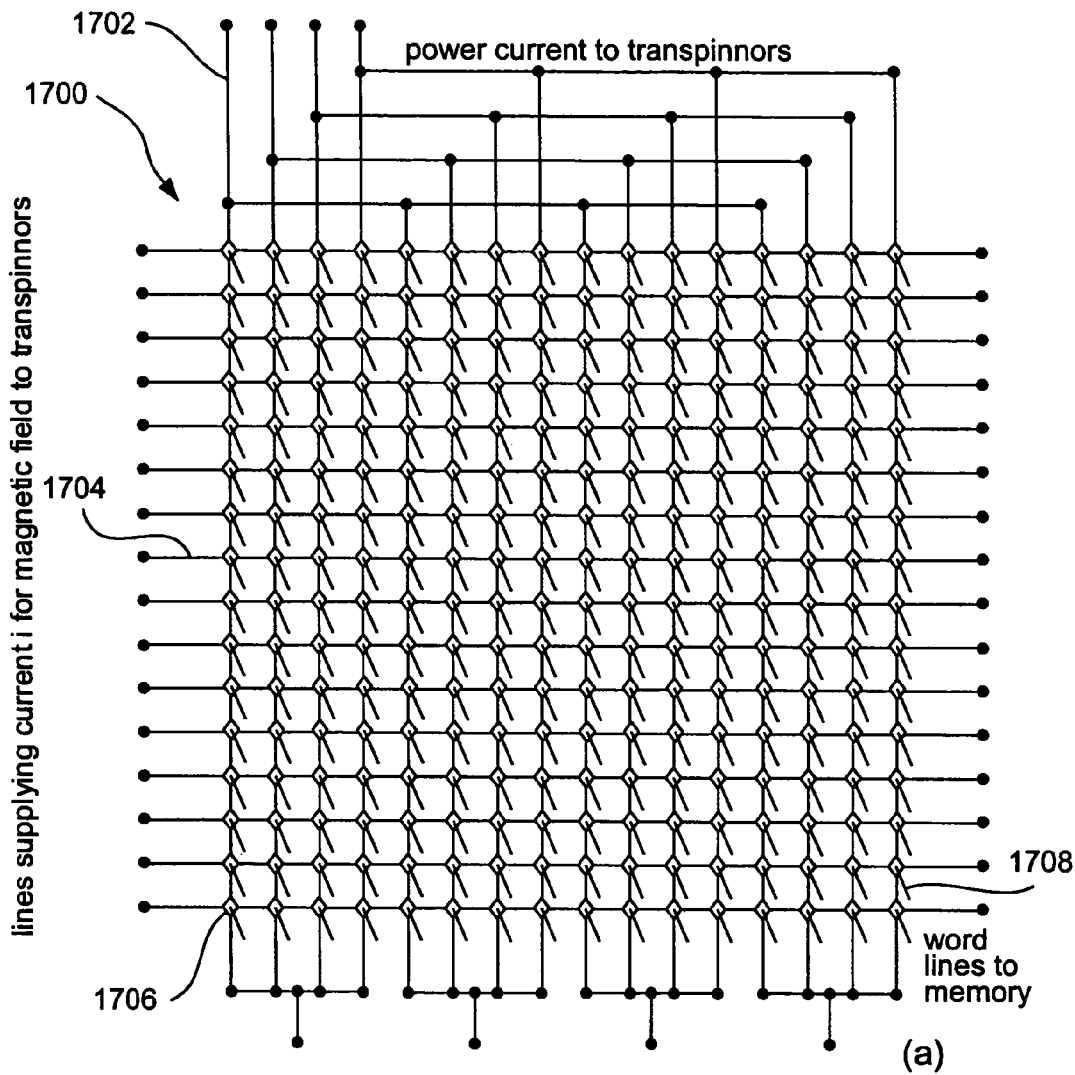
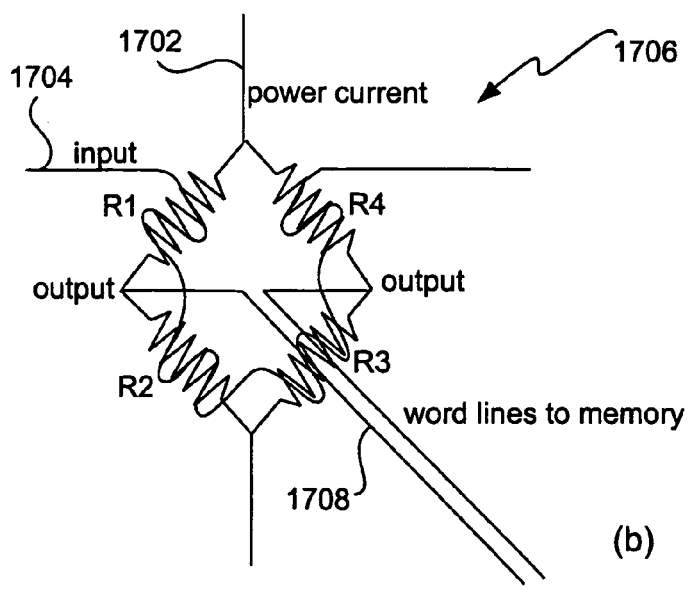
FIG. 17

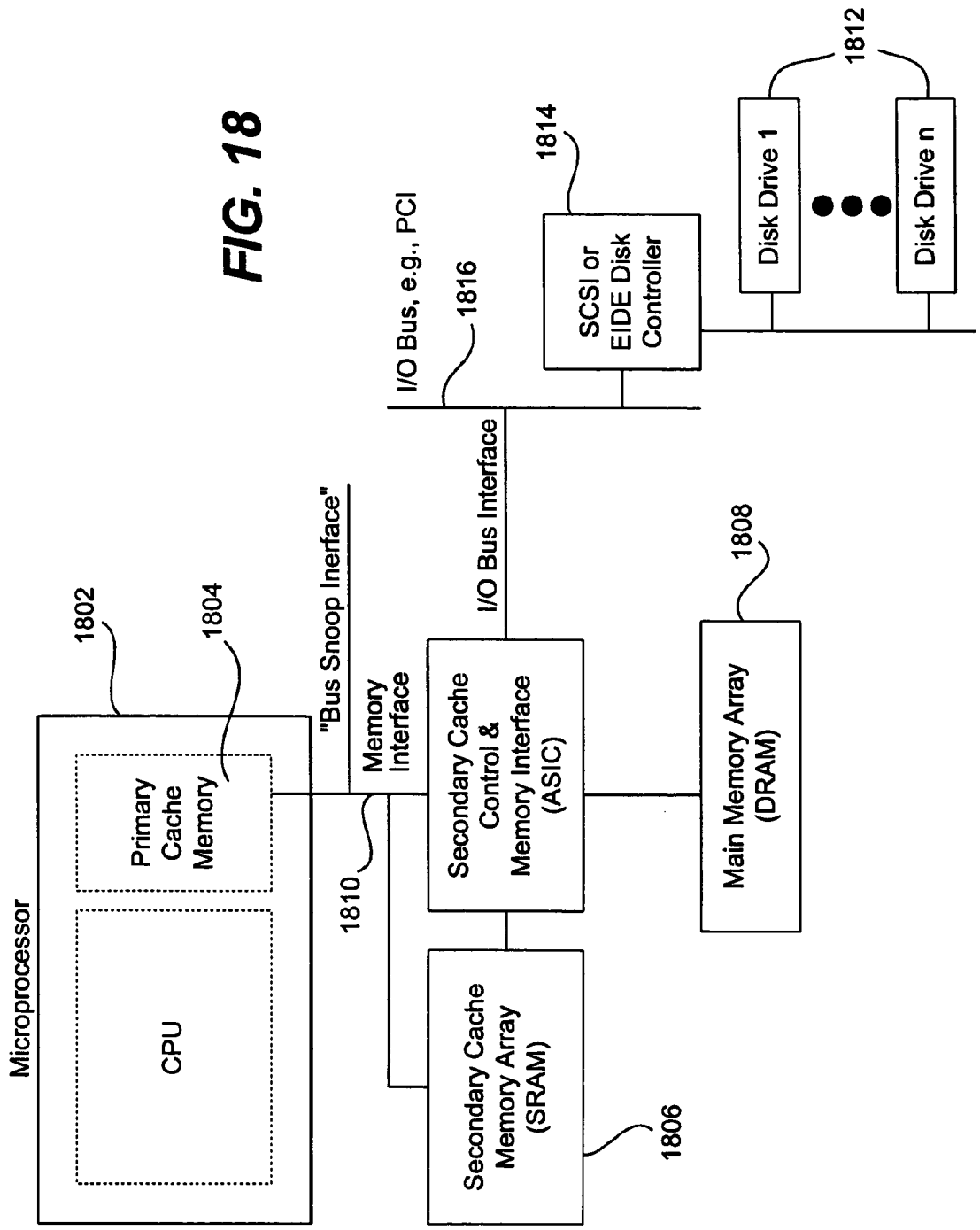

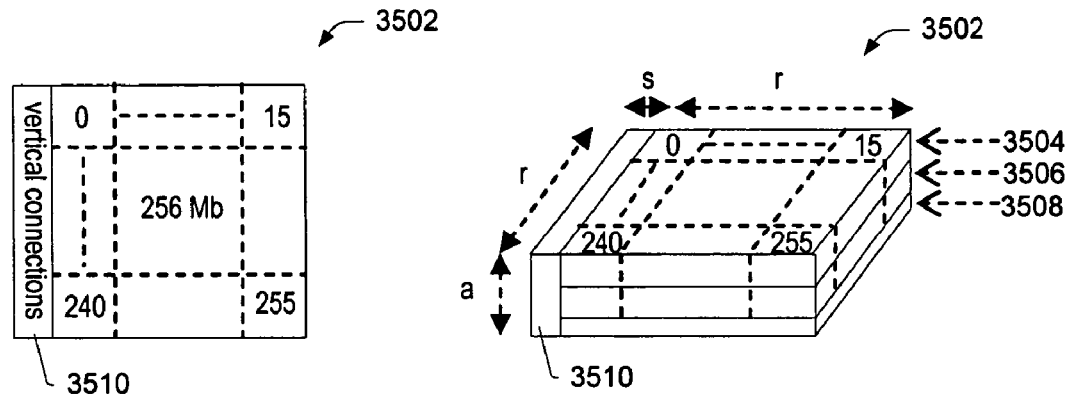
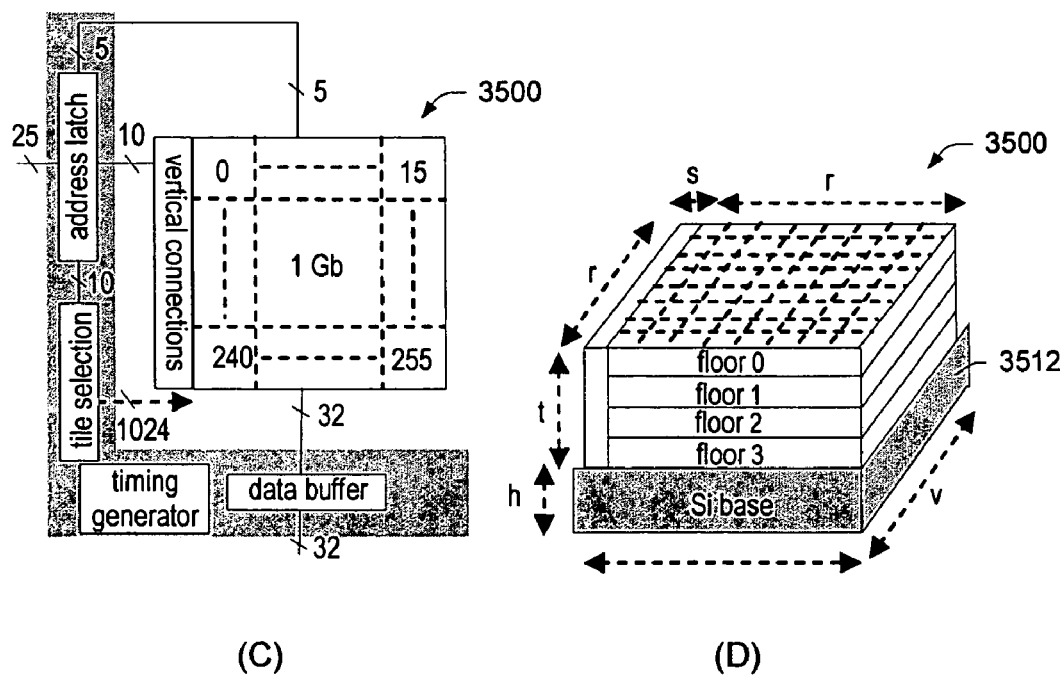
FIG. 35

ALL-METAL THREE-DIMENSIONAL CIRCUITS AND MEMORIES

RELATED APPLICATION DATA

The present application claims priority from U.S. Provisional Patent Application No. 60/436,103 for MANUFACTURING OF 3D ELECTRONIC COMPONENTS AND OF 3D NONVOLATILE MEMORY COMPONENTS filed on Dec. 20, 2002, the entire disclosure of which is incorporated herein by reference for all purposes.

BACKGROUND OF THE INVENTION

The present invention relates to electronic systems and, more specifically, to electronic and data processing systems constructed using all-metal circuit components. Still more specifically, the present invention provides techniques for constructing all-metal, three-dimensional circuits in which circuit components are stacked on top of one another.

Semiconductor technology provides the foundation of practically all electronic systems. The device density of silicon technology has increased steadily in the decades since its introduction and, until recently, roughly conformed to Moore's law which states that the device density of silicon chips doubles every eighteen months. That is, in recent years, the rate at which the bit density of silicon memories has improved has increasingly fallen short of the rate predicted by Moore's law. The limitations of semiconductor technology are readily apparent in the widening gap between its future potential and its past performance. There are a number of reasons for this.

In spite of the fact that the finer manufacturing geometry is aimed at offsetting the area increase brought about by the doubling of the transistor number, in practical terms the increase in number of transistors has increased the silicon area and the manufacturing costs.

The basic building element of semiconductor-based electronic components is the transistor. The quality of a transistor is directly determined by, among other factors, the perfection of the crystalline substrate structure used to manufacture it. Using currently available techniques, integrated circuits, which are collections of multiple interconnected transistors, can be reliably assembled only as "planar" or 2D structures because transistors can be built only on the top surface of a crystalline silicon wafer. Attempts to deposit silicon atoms, organized in perfect crystalline patterns, on top of an oxide, metal layer, or other layers have been unsuccessful thus far. Technology advances such as polycrystalline silicon structures and chemical-mechanical polishing have been utilized to build inferior quality transistors with reduced performance and increased dimensions.

In addition, improvements in transistor performance are limited by physical and process technology constraints. For example, as the feature size of silicon devices shrinks, undesirable effects occur including the loss of information through charge leakage, high oxide breakdown, and power consumption problems. Inherent limitations such as the non-scalability of p-n junctions and charge pumps also translates into an inability to take full advantage of advances in lithography.

Memory systems which incorporate mechanical elements, e.g., disk drives, are also facing technological obstacles relating to storage density such as, for example, the difficulty of mechanically aligning a read head with increasingly smaller storage locations on a magnetic storage medium. Access times for such memories are also typically orders of magnitude greater than that of the semiconductor memories which they complement. Such memories are also vulnerable to a variety of environmental stresses including, for example, shock, vibration, temperature extremes, radiation, etc. In combination, such limitations impede the dual objectives of greater information density and faster information access.

The evolution of memory technologies such as FLASH and EEPROM have addressed some of these limitations in that they have much faster access time than conventional magnetic memories and are more resistant to some environmental stresses, e.g., mechanical shock. However, these "hardcard" technologies do not have sufficient storage density or capacity to support the average stand-alone or networked computer system. Indeed, with a fraction of the capacity of standard disks, FLASH and EEPROM provide only supplemental storage capacity and have the added disadvantage of a limited number of access cycles. Moreover, although FLASH and EEPROM access times are better than those of conventional mechanical systems, they are clearly inferior as compared to DRAM or SRAM access times. In addition, the high power consumption per megabyte associated with FLASH and EEPROM necessitates larger power supplies, obviating the hardcard technologies' advantage in size and weight. Therefore, although FLASH and EEPROM provide advantages with regard to speed and reliability, these memory technologies cannot achieve the capacity or endurance of conventional magnetic disk drives.

In view of the foregoing, it is desirable to provide alternatives to conventional semiconductor technologies for building electronic systems.

SUMMARY OF THE INVENTION

According to the present invention, three-dimensional structures and methods of forming such structures are provided. According to a specific embodiment, a three-dimensional circuit is provided which includes a plurality of stacked levels on a substrate. Each level includes a plurality of all-metal circuit components exhibiting giant magnetoresistance and arranged in two dimensions. The circuit further includes an interconnect for providing interconnections between the circuit components on different ones of the plurality of levels.

According to a more specific embodiment, the plurality of circuit components on at least one of the levels includes a plurality of memory cells. Each memory cell comprises a multi-layer structure exhibiting magnetoresistance. According to an even more specific embodiment, each multi-layer structure comprises a plurality of magnetic layers, at least one of which is operable to magnetically store one bit of information. A plurality of the access lines are integrated with the plurality of magnetic layers and are configured such that the bit of information may be accessed using selected ones of the plurality of access lines and the giant magnetoresistive effect. The multi-layer structure may also include at least one keeper layer. The magnetic layers and the access lines (with or without the keeper layer) are part of a substantially closed flux structure.

According to another specific embodiment, the plurality of circuit components on at least one of the levels includes a plurality of active circuit components. Each active circuit component is operable to generate an output signal based on the giant magnetoresistive effect. According to a more specific embodiment, at least one of the active circuit components is a transpinnor comprising a network of multi-layer thin-film elements, at least one of which exhibits giant magnetoresistance. The transpinnor further includes a conductor magnetically (i.e., not electrically or resistively) coupled to the at least one thin-film element for controlling operation of the transpinnor. The transpinnor is operable to generate an output signal which is a function of a resistive imbalance among the thin-film elements and which is proportional to a power current in the network of thin-film elements.

According to another embodiment of the invention, a method for fabricating a three-dimensional circuit is provided. A substrate is provided on which is formed a first level of all-metal circuit components exhibiting giant-magnetoresistance. A second level of all-metal circuit components is formed on the first level. An interconnect structure interconnecting selected ones of the all-metal circuit components on the first and second levels is formed.

A further understanding of the nature and advantages of the present invention may be realized by reference to the remaining portions of the specification and the drawings.

BRIEF DESCRIPTION OF THE DRAWINGS

FIG. 17 is a simplified schematic of a memory access line selection matrix for use with specific embodiments of memory devices designed according to the present invention;

FIG. 18 shows a generalized computer memory hierarchy;

FIGS. 34–37 illustrate various implementations of stacked memory architectures according to the invention.

DETAILED DESCRIPTION OF SPECIFIC EMBODIMENTS

Figure 1:
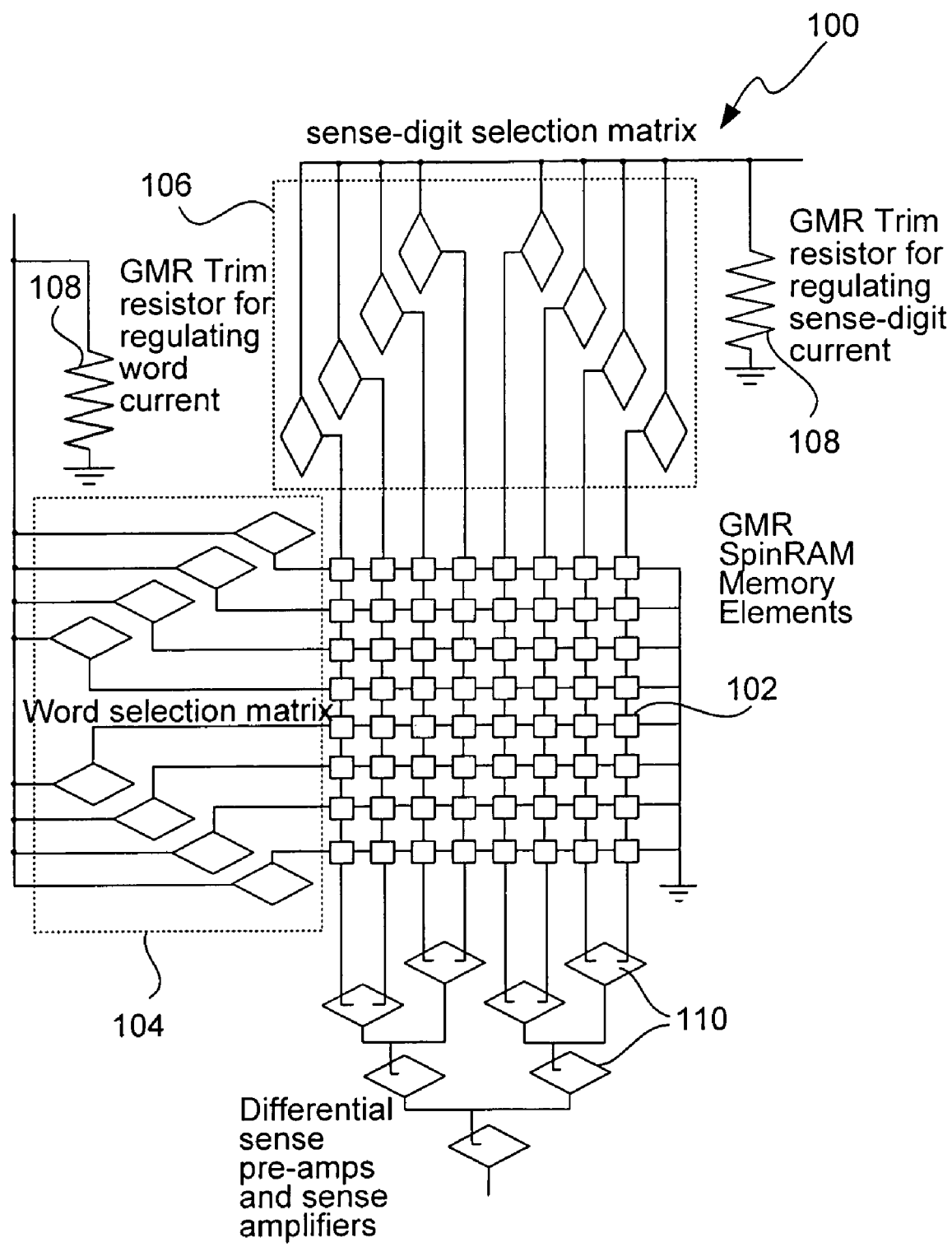
FIG. 1 is a simplified schematic of an all metal GMR memory designed according to a specific embodiment of the present invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known features may not have been described in detail to avoid unnecessarily obscuring the invention.

Various embodiments of the present invention take advantage of recent advances in memory technology and electronics based on the property of giant magnetoresistance (GMR) as well as other technologies based on magnetism and the magnetic properties of materials. The present invention provides three-dimensional (3D) structures which employ all-metal circuit components (e.g., memory cells and electronic circuits) as basic building blocks, as well as techniques for manufacturing such structures. Such 3D structures are possible because the all-metal circuit components and structures employed by the present invention are not limited in the manner described above with regard to semiconductor components and structures. It should be noted that, as used herein, the term "all-metal" refers to devices and structures which do not include semiconductor materials but may (and typically do) include non-metal insulating materials.

It should be understood that this expansion of circuitry in a third dimension transcends applications and provides an enabling technology for a wide variety of electronic circuits and systems. In addition, various embodiments of the invention may be characterized by some or all of the following benefits with regard to more conventional technologies. For example, the memory cell technologies which may be employed by the present invention have the potential to surpass the highest bit density achievable with current mechanical storage technologies while enjoying the attendant advantages of solid-state technologies, e.g., speed and ruggedness. In addition, expansion of the all-metal circuitry in the third dimension does not diminish the performance characteristics of that circuitry compared with the two-dimensional disposition.

And because silicon circuit fabrication costs are generally proportional to area rather than volume, the 3D technologies described herein also have the potential for surpassing the lowest cost per bit achievable by current technologies. In addition, the 3D structures enabled by the present invention typically result in shorter connections between circuits and components which, in turn, may result in reduced power consumption, increased operating speeds, and reductions in undesirable transmission line effects.

It should also be noted that because the all-metal components employed by various embodiments of the invention are inherently radiation hard, there is no need for the expensive measures required to ensure the survivability of semiconductor-based systems in intense radiation environments. Moreover, specific embodiments of the invention also benefit from the fact that logic-level margins for some all-metal circuit components remain stable with decreasing feature size. That is, for example, as will be described, the logic levels associated with transpinnor components are independent of features size and therefore remain robust as features sizes shrink. As is well known, this is not the case with semiconductor technologies which experience severe logic-level margin degradation as features sizes are reduced.

Exemplary implementations of all-metal memories which may be used with various embodiments of the present invention are described in U.S. Pat. No. 6,483,740 for ALL-METAL GIANT MAGNETORESISTIVE MEMORY issued on Nov. 19, 2002, the entire disclosure of which is incorporated herein by reference for all purposes. FIG. 1 is a simplified diagram of an all metal random access memory 100, also referred to herein as a SpinRAM, designed according to a specific embodiment of the present invention. For the sake of clarity, only 64 storage cells 102 have been shown. It will be understood, however, that the simplified architecture of FIG. 1 may be generalized to any size memory array desired. It should also be noted that the control lines for the selection electronics have been omitted for the same purpose.

Examples of memory cells for use with the present invention are described in U.S. Pat. No. 5,587,943 for NONVOLATILE MAGNETORESISTIVE MEMORY WITH FULLY CLOSED FLUX OPERATION issued on Dec. 24, 1996, and in U.S. Pat. No. 6,594,175 for HIGH DENSITY GIANT MAGNETORESISTIVE MEMORY CELL issued on Jul. 15, 2003, both of which are incorporated herein by reference in their entireties for all purposes. Specific examples of such storage cells and basic theories of operation will be described below.

Figure 2:
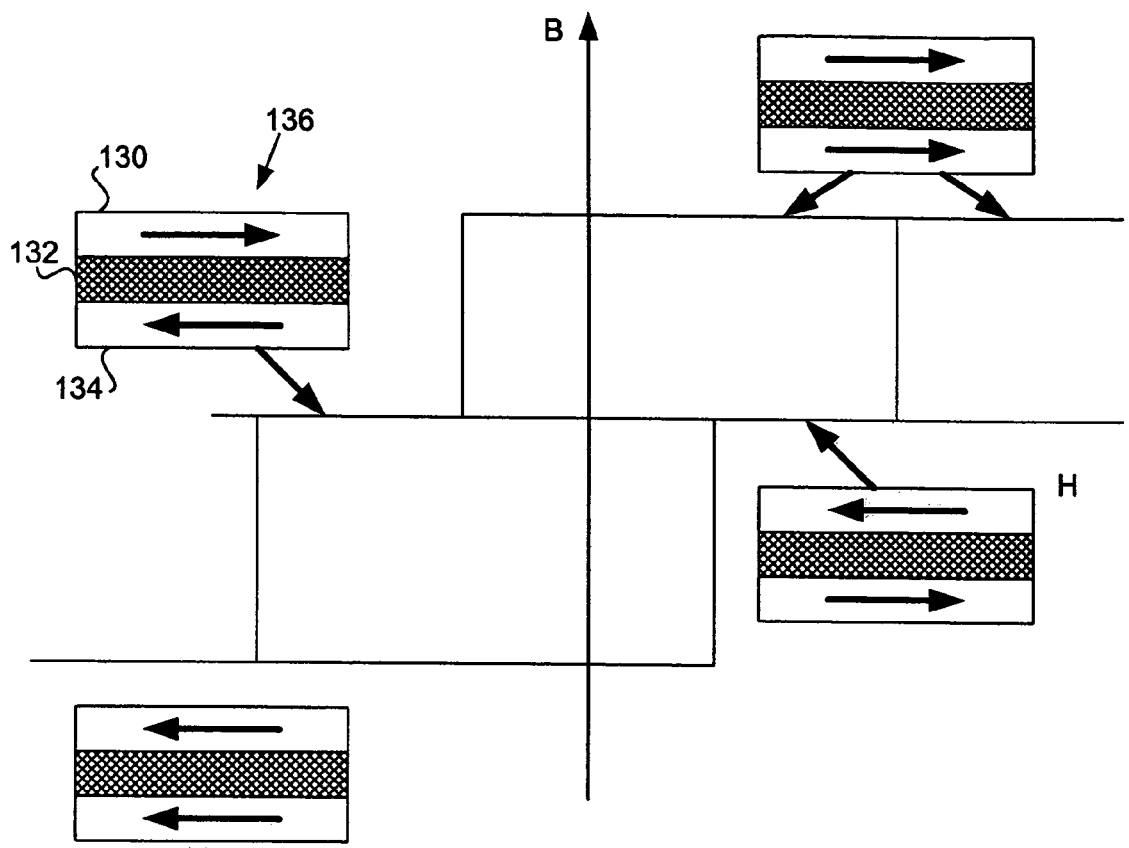
FIGS. 2 and 3 show the operation of a GMR memory cell.

FIG. 2 shows the major hysteresis loop of a GMR exchange-coupled triple-layer film which may be used as a storage element according to specific embodiments of the present invention. Two magnetic layers 130 and 134 are separated by a nonmagnetic layer 132. The two magnetic layers have coercivities that differ by more than the exchange coupling between them such that layer 130 has a high coercivity (e.g., cobalt) and layer 134 has a low coercivity (e.g., permalloy). Film cross sections 136 show the magnetization at each part of the loop.

Beginning at the upper right quadrant, both top and bottom layers 130 and 134 are saturated in the same direction. If the applied field H is reduced to substantially zero and then reversed in direction, the layer having the lower coercivity switches first, as shown by the cross section in the upper left quadrant. The switching occurs when the field is equal to the sum of the coercivity of the lower coercivity film plus the coupling field.

As the applied field H is increased in the negative direction, the film layer having a higher coercivity switches directions, as depicted in the lower left quadrant. This switching occurs when the field magnitude is equal to the coercivity of the higher-coercivity film less the value of the exchange coupling. Thus, switching is carried out in such films in a two-step process.

Figure 3:
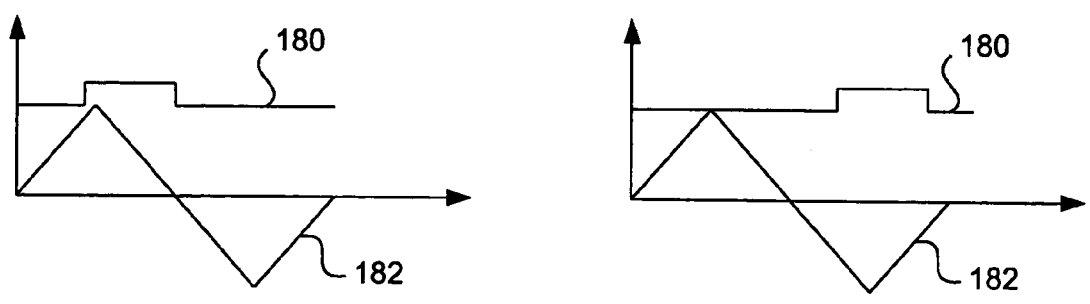

Readout of the memory cell of FIG. 2 is achieved in a nondestructive fashion by measuring the resistance change in response to the change in the magnetization obtained by applying a field from a word line. The application of the field switches the lower-coercivity film. FIGS. 3(a) and 3(b) depict the resistive signals 180 when a triangular word current 182 is applied. FIG. 3(a) shows the signal corresponding to a "zero" state and FIG. 3(b) shows the signal corresponding to a "one" state.

Figure 4:
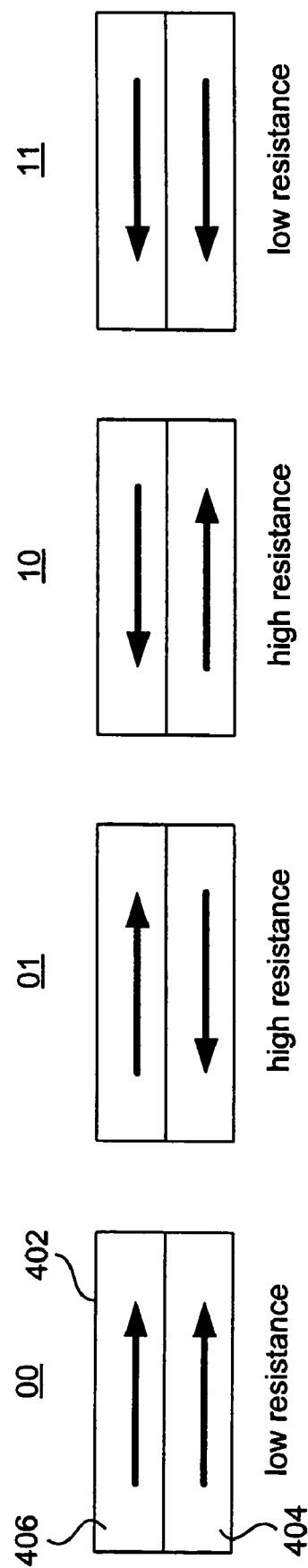
FIG. 4 shows the magnetization states of a GMR memory cell.

FIG. 4 shows four magnetization states of a memory cell 402 having a low coercivity storage layer 404 and a high coercivity storage layer 406. As indicated in the figure, each of the states represents a unique two-bit combination. That is, the state "00" is shown as both storage layers being magnetized to the right while the state "11" is shown as both layers being magnetized to the left. Because the magnetization vectors in this states are parallel, they exhibit relatively low resistance. By contrast, the states "01" and "10" are both characterized by the magnetization vectors oriented in opposite directions, i.e., a relatively high resistance state as compared to the parallel vectors due to the GMR effect.

Those of skill in the art will understand how each of the states may be written to memory cell 402. That is, layer 406 is magnetized first by the application of a magnetic field which overcomes the layer's coercivity. Because of its lower coercivity, layer 404 is also magnetized in the same direction, at least initially. The antiparallel state of layer 404 may then be written by application of a second magnetic field of the opposite orientation which is sufficient to overcome the coercivity of layer 404 but not layer 406.

Figure 5:
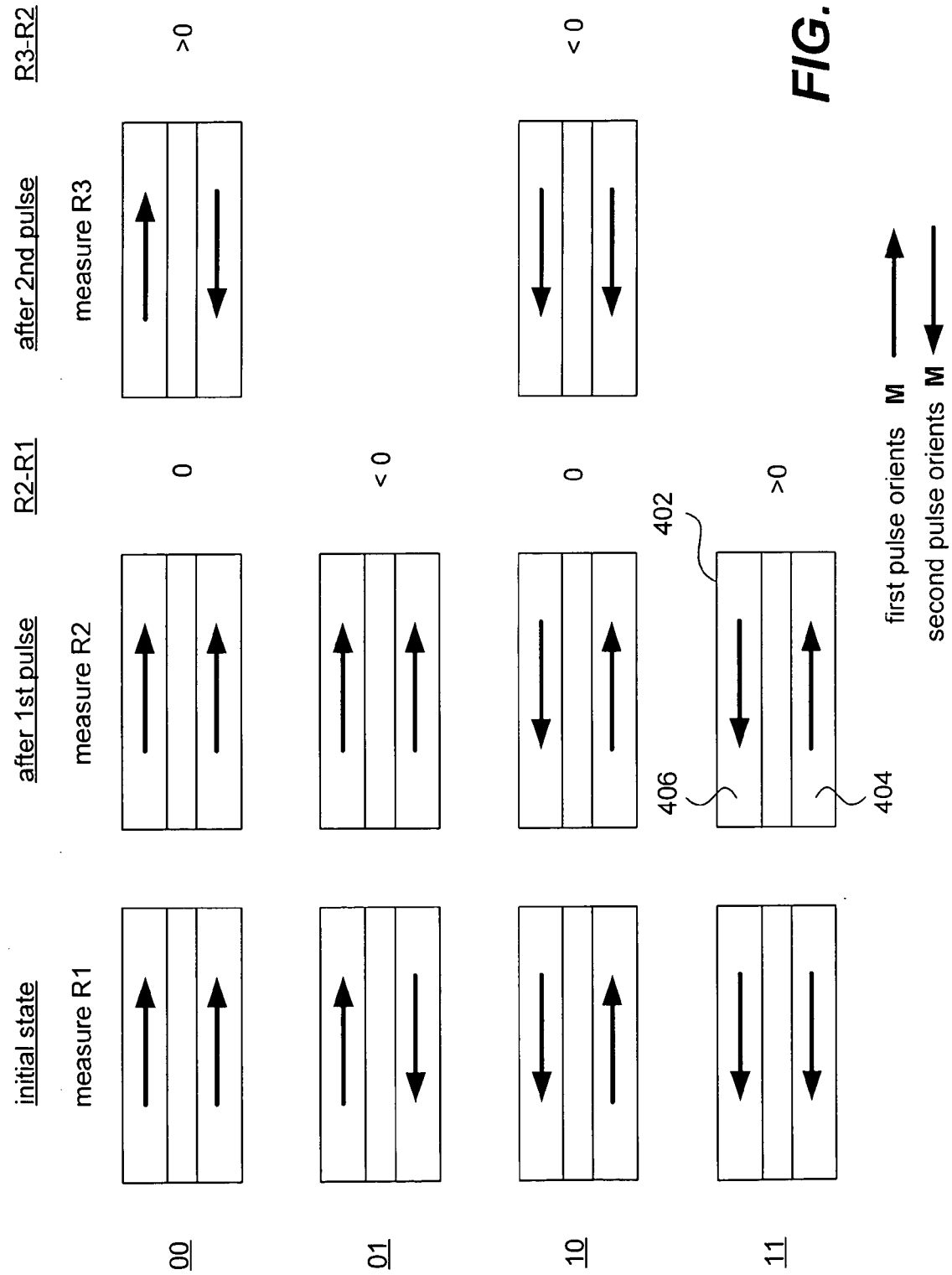
FIG. 5 illustrates operation of a GMR memory cell according to a specific embodiment of the present invention.

The reading of the information stored in memory cell 402 will now be described with reference to FIG. 5. As will be described, the read out process may vary depending upon the initial state of the cell. Initially, a resistance value $R_1$ associated with the multi-layer cell is measured while the cell is in an initial state (column 1). A magnetic field is then applied which is sufficient to overcome the coercivity of layer 404 and magnetize layer 404 in a particular direction, e.g., to the right as shown. A resistance value $R_2$ is then measured after the application of the magnetic field (column 2), and the difference between $R_1$ and $R_2$ determined (column 3). In the example shown, if $R_2-R_1$ is less than zero, then the initial state of the cell is determined to be the "01" state. Similarly, if $R_2-R_1$ is greater than zero, the initial state corresponds to the "11" state. The initial state is then rewritten to the cell.

If, on the other hand, there is no difference between $R_1$ and $R_2$, the initial state could have been either "00" or "10". If all that is desired is to determine the state of the low coercivity layer 404, i.e., "0" in both instances, no further action need be taken. However, if the state of layer 406 must be determined, a second magnetic field may be applied in the direction opposite to the first magnetic field, e.g., to the left in this example, and a third resistance value $R_3$ measured (column 4). If $R_3-R_2$ is greater than zero, the initial state is determined to be "00"; if less than 0, the initial state is determined to be "10" (column 5). The initial state is then rewritten to the cell.

Although specific embodiments of the invention (such as the one described above with reference to FIG. 5) refer to layers having different coercivities (e.g., layers 404 and 406), it should be noted that other embodiments of the invention employ layers having the same coercivities, relying on alternative mechanisms to effect storage and readout. An example of such a mechanism is the use of localized fields to switch one layer without switching a nearby layer having the same coercivity. Examples of such embodiments are described below.

According to various other embodiments of the present invention, memory cell designs are provided in which multiple bits of information may be stored in one memory cell. Specific embodiments will be described below in which 2, 3, or 4 bits of information may be stored in one memory cell and which employ either destructive read out (DRO) and nondestructive read out (NDRO). It will be understood, however, that particular ones of these designs may be generalized to store more bits of information than described.

Three embodiments which employ DRO will now be described with reference to FIGS. 6 and 7. Each of the described embodiments employs cobalt storage layers, copper access lines, and a double keeper. However, it will be understood that a variety of materials may be employed for various ones of these elements without departing from the scope of the invention.

Figure 6:
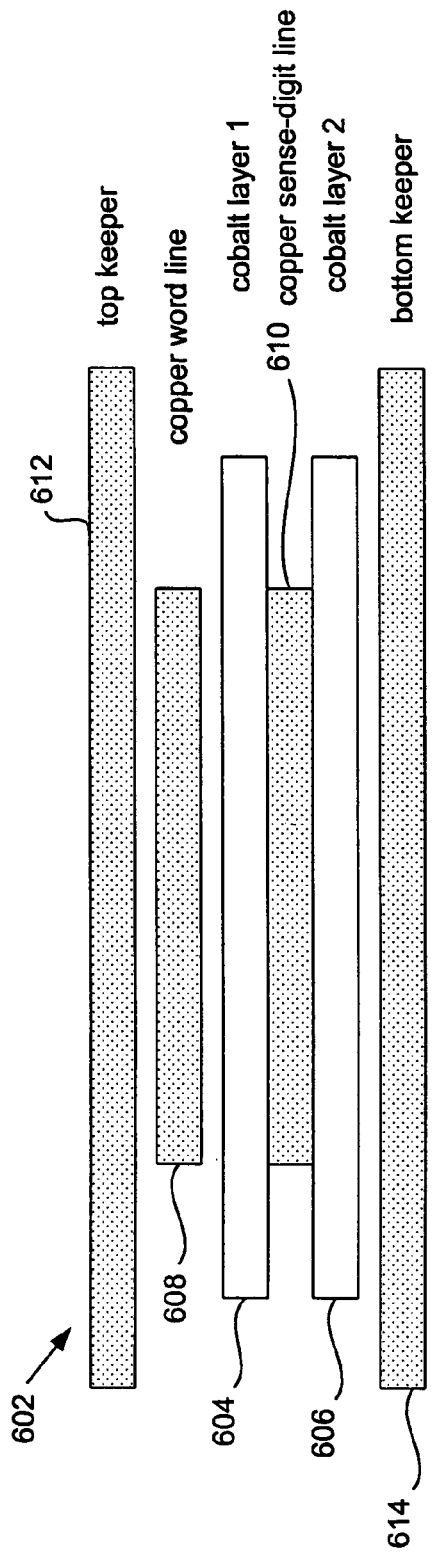
FIG. 6 shows a dibit memory cell designed according to a specific embodiment of the invention.

FIG. 6 shows a memory cell 602 configured to store two bits of information. Cobalt layers 604 and 606 are provided in which the individual bits of information are to be stored as represented by the magnetization vector associated with each. According to a specific embodiment, the coercivities of layers 604 and 606 are substantially equal. A copper word line 608 and a combined copper sense-digit line 610 are provided to provide read and write access to cell 602. Top and bottom keepers 612 and 614 are provided to ensure that memory cell 602 is a substantially closed flux structure. Such a double keeper configuration cancels any demagnetizing field from a magnetic film but does not impede the field from a strip line. Other cell structures with substantially closed flux structures may be constructed without the use of either or both keeper layers.

It should be noted that insulation layers are represented by the blank spaces between the layers shown. These layers were omitted for purpose of clarity. In addition, the various layers are shown having different widths for illustrative purposes. However, the layers of actual embodiments are typically the same width. Finally, it will be understood that the vertical dimension of the figures of the application are often exaggerated for illustrative purposes.

A memory module based on the memory cell of FIG. 6 may be similar to a memory module based on the single-bit memory cell of U.S. Pat. No. 5,587,943 incorporated by reference above. That is, such a memory module may have serpentine word lines generally oriented in the x-direction and sense-digit lines generally oriented in the y-direction as shown, for example, in FIG. 11. In such embodiments, the word and sense-digit lines run in the same direction at each bit location. Selection matrices are provided for selecting the word and sense-digit lines as well as low level gates and sense amps for the sense-digit lines. According to other embodiments of the invention, memory cells and modules are designed such that the word lines are straight and orthogonal to separate sense and digit lines as shown, for example, in FIGS. 12(a) and 12(b).

One can understand how to write to the dibit memory cell 602 of FIG. 6 by application of the right hand rule. That is, when the current in word line 608 is parallel to that in sense-digit line 610 and the amplitudes are equal, the field between these lines is zero, i.e., cobalt layer 604 experiences no applied field. However, the field experienced by cobalt layer 606 is the sum of the field contributions from the two lines. Thus, cobalt layer 606 may be written using coincident currents of the same polarity in lines 608 and 610, each of which may generate a field which by itself could not overcome the coercivity of layer 606 (i.e., less than $H_C$), but which, when combined with the field from the other line is sufficient to impose a magnetization on layer 606 (i.e., greater than $H_C$).

When, on the other hand, the current in word line 608 is antiparallel to that in sense-digit line 610 and the amplitudes of the currents are substantially equal, the combined field outside of lines 608 and 610 is effectively zero while the field between the lines, i.e., the field experienced by cobalt layer 604, is doubled. Thus, cobalt layer 604 may be written using coincident currents in the word and sense-digit lines of opposite polarity, each of which may have a field less than $H_C$ but whose combined sum is greater than $H_C$.

According to a specific embodiment, the procedure for reading dibit memory cell 602 involves several steps. Initially, the resistance of sense-digit line 610 is measured. A logic state, e.g., a "1", is then written to cobalt layer 604 with coincident currents in access lines 608 and 610 as described above. The resistance of sense-digit line 610 is then measured again. If it has changed, it is determined that the initial state of layer 604, i.e., the bit of information originally stored in layer 604, is different than the current state, e.g., if the layer was written as a "1" it must have previously been a "0". If the resistance has not changed, the opposite conclusion is established, i.e., that the bit of information originally stored in layer 604 is the same as in the current state.

The state of layer 606 may subsequently be determined by reversing the state of layer 604 and comparing the resulting resistance to the last resistance measurement. The state of layer 606 may then be determined from whether the resistance increases or decreases. For example, if the top layer is switched from a "1" to a "0" and the resistance decreases, the bottom layer must be a "0", i.e., the magnetization vectors of the two layers are now aligned. By contrast, if in such a scenario the resistance increased after such a switch, the bottom layer must be a "1", i.e., the magnetization vectors of the two layers are now antiparallel. After a read operation, the original states of layers 604 and 606 may be rewritten as required. Of course, it will be understood that a read operation may be performed to determine the state of both of the storage layers as described above, or to determine the state of either of the films separately.

It will be understood that variations on the structure of memory cell 602 may be made without departing from the scope of the present invention. For example, the respective coercivities or compositions of storage layers 604 and 606 may be varied. In addition, the current amplitudes of the current used to access memory cell 602 need not necessarily be equal to enable operation according to the principles of the present invention.

Figure 7:
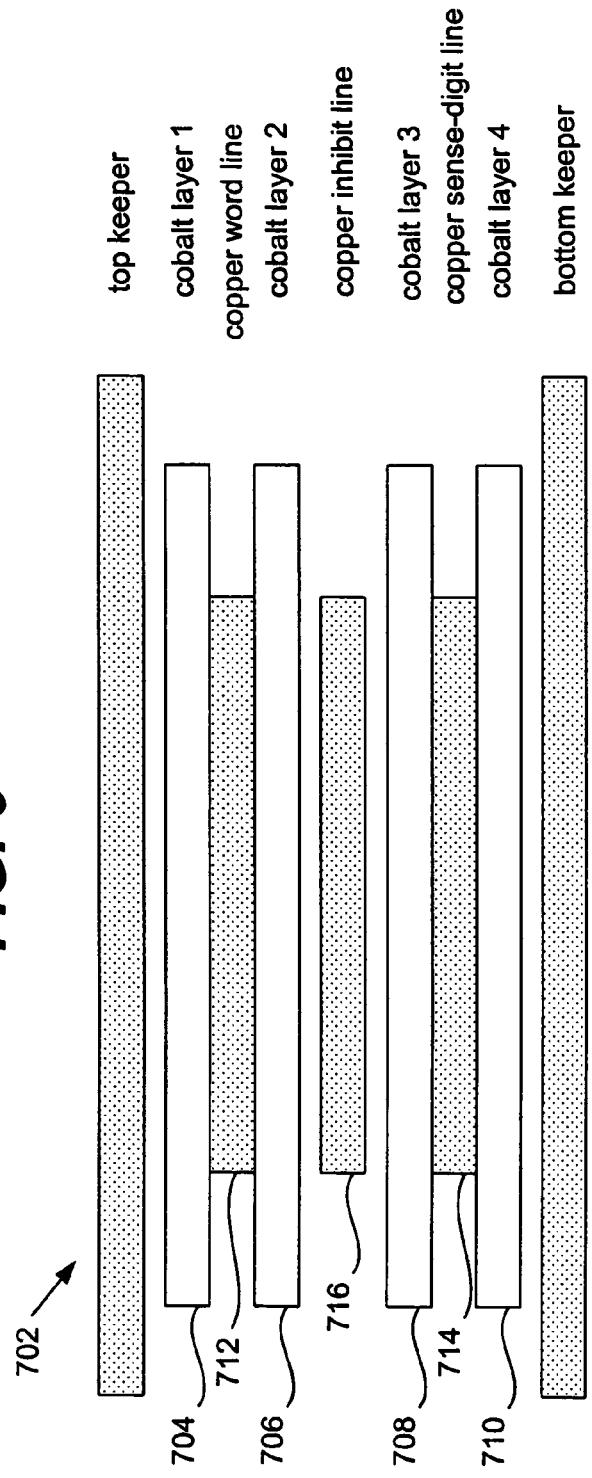
FIG. 7 shows a triple or quad bit memory cell designed according to another specific embodiment of the invention.

FIG. 7 shows a memory cell 702 which may be configured according to various specific embodiments to store three or four bits of information. As with memory cell 602 of FIG. 6, insulating layers in the gaps between layers are not shown and the vertical dimension is exaggerated for clarity. In addition, in an actual embodiment, the films and access lines would likely be the same width but are differentiated here for illustrative purposes.

Memory cell 702 has four cobalt storage layers 704, 706, 708 and 710 each of which is capable of storing one bit of information. The cell access lines include a copper word line 712, a copper sense-digit line 714, and a copper inhibit line 716. The term "inhibit line" is used in reference to the inhibit line of the old ferrite core memories which employed three wires per cell. According to a specific embodiment of the invention, an inhibit line allows a 3:1 ratio of field at selected to unselected locations, which is larger than the 2:1 ratio when there is no inhibit line. According to some embodiments, the inhibit line of the present invention links all of the bits in an array. According to other embodiments, the inhibit line does not link all bits in the array. Rather they are configured to run diagonally through the array and are furnished with their own selection matrix.

As will become apparent, in three-bit embodiments, the magnetization states of storage layers 704 and 710 (and thus the information stored therein) are not independent. That is, each is magnetized in the opposite direction of the other. According to other embodiments (discussed below), this symmetry can be broken using a variety of techniques such that each of the four storage layers may be written and read independently.

According to the three-bit embodiment, the storage layers of memory cell 702 are characterized by substantially equal coercivities and may be written by the application of different combinations of coincident currents in the three access lines. The fields generated as a result of the applied currents are given by:

$$H_1 = k\{-I_w - I_i - I_d\} \quad (1)$$

$$H_2 = k\{I_w - I_i - I_d\} \quad (2)$$

$$H_3 = k\{I_w + I_i - I_d\} \quad (3)$$

$$H_4 = k\{I_w + I_i + I_d\} \quad (4)$$

where $I_w$, $I_i$, and $I_d$ correspond to the currents in the word, inhibit, and sense-digit lines, respectively, $H_1$–$H_4$ are the fields in layer 704–710, respectively, and k is a constant of proportionality inversely proportional to the line width and equal to $2\pi$ Oe per ma for a 1 micron width.

From these equations, it can be seen that layers 706 and 708 may each be switched with a current pulse combination that will not switch any other film in the cell. For example, if $I_w = +H_c/3k$ and $I_i = I_d = -H_c/3k$, then the field at layer 706 is $H_c$, while the field at layers 704 and 708 is $H_c/3$ and the field at layer 710 is $-H_c/3$. That is, there is a three-to-one ratio between the field at the desired storage layer and each of the other storage layers. It can also be seen, however, that in this particular embodiment where the coercivities of layers 704 and 710 are substantially equal, these layers do not switch independently. That is, a field combination that switches one of these two layers will switch the other in the opposite direction. Thus, in such an embodiment where layers 704 and 710 are interdependent in this way, only three bits of information may be stored in or retrieved from memory cell 702.

To effect reading of the information in three-bit memory cell 702, the control electronics for word line 712 and sense-digit line 714 are the same. That is, low-level gates and pre-amps are situated at the ends of each making the word lines, in effect, word-sense lines. The reading of an individual cobalt storage film is achieved in much the same way as described above with regard to dibit memory cell 602. That is, the resistance of the access line to which the storage film of interest is attached is measured. A logic state is then written to the storage film of interest and the resistance of the associated access line measured again. If the resistance changes, the storage film was originally in the opposite state of the logic state that was just written. If the resistance does not change, then the current logic state is the same as the original logic state. Also as described above with reference to dibit memory cell 602, the state of the other storage film associated with the same access line may be determined by switching the first film again and determining whether the resistance goes up or down.

According to various specific embodiments, memory cell 702 is modified such that all four storage layers may be used to store independent bits of information. That is, memory cell 702 has enough storage layers to store four bits of information. However, as discussed above, if the coercivities of the layers are substantially equal, any current pulse sequence which writes storage layer 704 to a particular logic state will also write storage layer 710 to the opposite state.

According to a first embodiment, memory cell 702 becomes a four-bit memory cell with the addition of another access line (placed, for example, above cobalt layer 1) to break the symmetry which results in the interdependency of layers 704 and 710. This embodiment requires an additional masking level and an additional selection matrix to control the added access lines.

According to a second embodiment, the compositions of storage layers 704 and 710 are made sufficiently different such that their switching thresholds require different field strengths for switching. This may be accomplished, for example, by depositing a permalloy layer directly over the cobalt film of storage layer 704. This will give layer 704 a lower coercivity than layer 710. Thus, when coincident currents are applied to the access lines, the resulting fields will write layer 704 before writing layer 710.

According to a third embodiment, the separation spacing between the keepers and the cobalt storage films is adjusted such that demagnetizing fields become significant enough to break the symmetry. This embodiment takes advantage of the fact that even a perfect keeper doesn't completely cancel the demagnetizing field of a finite size magnetic film spaced a nonzero distance from the keeper. Such a demagnetizing field is proportional to the distance between the magnetic filed and the keeper. This demagnetizing field can be used to break the symmetry and allow both layer 704 and layer 710 to be written to the same state. For example, if one wishes to write a "0" to both layers 704 and 710, a pulse combination may first be applied which writes a "1" to layer 704 and a "0" to layer 710. A "1" is then written into each of layers 706 and 708. This results in a demagnetizing field which tends to bias layers 704 and 710 toward the "0" state. Thus, when a subsequent pulse combination is applied which tends to write layer 704 in the "0" state and layer 710 in the "1" state, only layer 710 is switched. This leaves both layers 704 and 710 in the same state, e.g., "0". Layers 706 and 708 may then be written independently.

According to a fourth embodiment, a keeper layer replaces a portion of the center of line 716. This shields layers 704, 712 and 706 from the field generated by currents in layer 708, 714 and 710, and vice versa. This removes the redundancy and allows four bits of information to be independently stored.

The four-bit embodiment of memory cell 702 may be read in much the same way as the three-bit embodiment described above. According to a specific embodiment, this may be done by switching only the interior bits (i.e., layers 706 and 708) and using the read procedure described with reference to the dibit memory cell 602 of FIG. 6.

Figure 8:
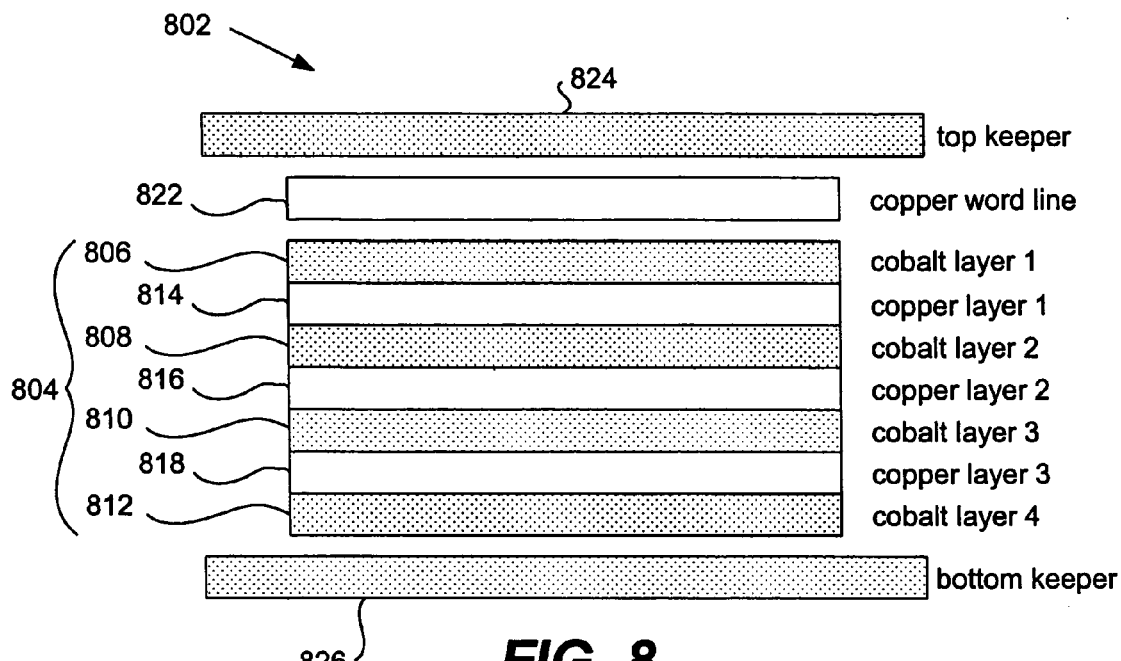
FIG. 8 shows a dibit memory cell designed according to yet another specific embodiment.

According to further specific embodiments of the present invention, multi-layer memory cells are stacked to achieve increased information storage density. A double-density stacked memory cell 802 designed according to one such embodiment is shown in FIG. 8. According to various embodiments, this structure may be employed for 2-bit NDRO or 4-bit DRO. Memory cell 802 includes a GMR film structure 804 which functions as the sense-digit line of the cell. According to the specific embodiment shown, structure 804 is a multi-layer GMR structure having four cobalt layers 806, 808, 810, and 812, separated by three copper layers 814, 816, and 818. The cell also includes a copper word line 822 and top and bottom keepers 824 and 826. The purpose of the double keeper is to cancel the demagnetizing fields from the magnetic films while not impeding the fields from the access lines. For illustrative purposes, insulating layers located in the blank spaces between noncontiguous layers are not shown and the vertical dimension of the cell is exaggerated.

The reading and writing of memory cell 802 will now be described with reference to the FIGS. 9(a) and 9(b) which show the resulting magnetic fields from opposing currents in multi-layer GMR structure 804. Current flowing out of the page through GMR structure 804 generates a magnetic field 902 as shown in FIG. 9(a). The field is oriented to the left in the top two cobalt storage layers 806 and 808 and to the right in the bottom two cobalt storage layers 810 and 812. As will be understood, magnetic field 902 is stronger at layers 806 and 812, weaker at layers 808 and 810, and zero at the center of the structure.

In FIG. 9(b), the direction of the current is reversed, i.e., into the page, and reduced in magnitude such that the coercivities of the inner layers 808 and 810 are not overcome by magnetic field 904. This results in the switching of layers 806 and 812 but not layers 808 and 810 as shown. The result is that each cobalt film is magnetized antiparallel to its neighbor(s), a configuration which yields the highest magnetoresistance of sense-digit line 804.

Because the conductivity of copper is much larger than that of cobalt, the approximation that all of the current in sense-digit line 804 is carried by the copper layers may be made. Using this approximation, it can be seen that the magnitudes of the fields in layers 806 and 812 are approximately three times the magnitudes of the fields in layers 808 and 810. For example, the field experienced by cobalt layer 808 from copper layer 814 is cancelled by the field from copper layer 816, leaving only the field component from copper layer 818. By contrast, cobalt layer 806 experiences positive field contributions from each of the copper layers. This difference in field magnitude is the basis for operating the stacked memory cells of the present invention.

Figure 9:
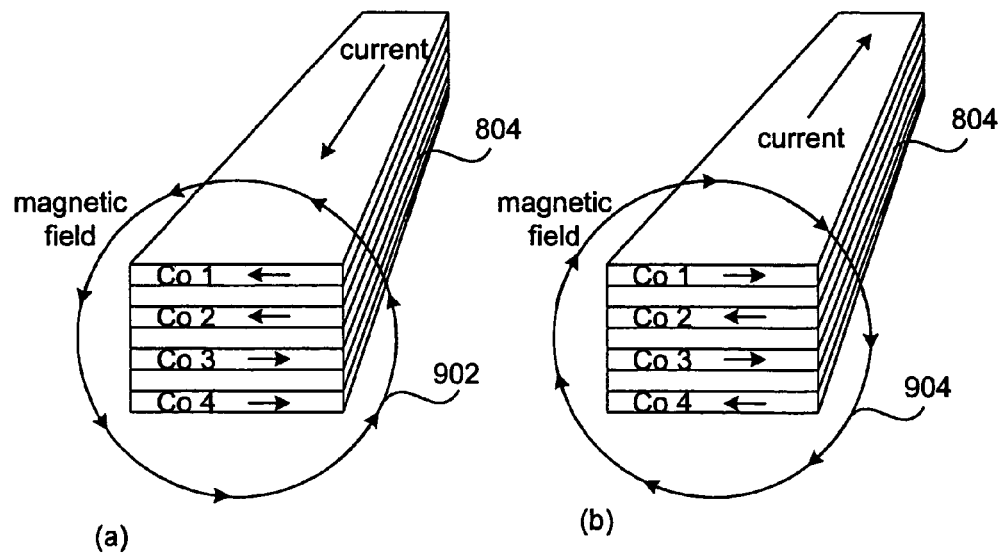
FIG. 9 shows the relationship between magnetic fields and current in a GMR thin film structure.

The writing of the dibit memory cell 802 according to a specific embodiment of the invention will now be described with reference to FIGS. 8 and 9. According to this embodiment, the two inner cobalt layers 808 and 810 are used to store the information, and the two outside cobalt layers 806 and 812 are used to read out the information nondestructively, i.e., NDRO. The memory cell is written with a coincidence of currents in word line 822 and sense-digit line/GMR structure 804. Because, as discussed above, a current in sense-digit line 804 results in a much larger field at the outer cobalt layers than at the inner cobalt layers, it is possible to switch the outer layers without disturbing the inner ones.

A current in sense-digit line 804 will result in a magnetic field in cobalt layer 808 which is equal and opposite to the field experienced by cobalt layer 810. When a coincident current is applied to word line 822, the resulting field will add to the field in one of layers 808 and 810 and subtract from the other. This makes it possible to write to either one of layers 808 or 810 without disturbing the other. So, for example, to write to layer 810, a current which produces a field of magnitude $H_C/2$ at layer 810 is applied to sense-digit line 804 in the direction out of the page (see FIG. 9). A current one-third as large is coincidentally applied to word line 822 in the same direction resulting in another field of magnitude $H_C/2$ at layer 810. The combined field has a magnitude Hc which is sufficient to switch layer 810. However, because the first field contribution at layer 808 is $-H_C/2$, the two fields cancel and layer 808 does not switch.

To read the information stored in dibit memory cell 802 the magnitude of the read current in sense-digit line is ⅓ of that of the write current. This results in a field of $H_C/2$ at layer 806 and $-H_C/2$ at layer 812. The resulting fields at layers 808 and 810 are of magnitude $H_C/6$ and will therefore not cause any switching of these layers. To read the information in layer 808, layer 806 is written, i.e., magnetized, in a first direction and the resistance of sense-digit line 804 is measured. Layer 806 is then written in the other direction and the resistance measured again. The two resistance measurements are then compared. The resistance will be lower when layers 806 and 808 are magnetized in the same direction, and higher when they are magnetized in opposite directions. Therefore, the direction of magnetization of layer 808, i.e., the logic state stored in layer 808, may be determined from the comparison of the resistance values. The reading of layer 810 is achieved using the same procedure with layer 812.

Figure 10:
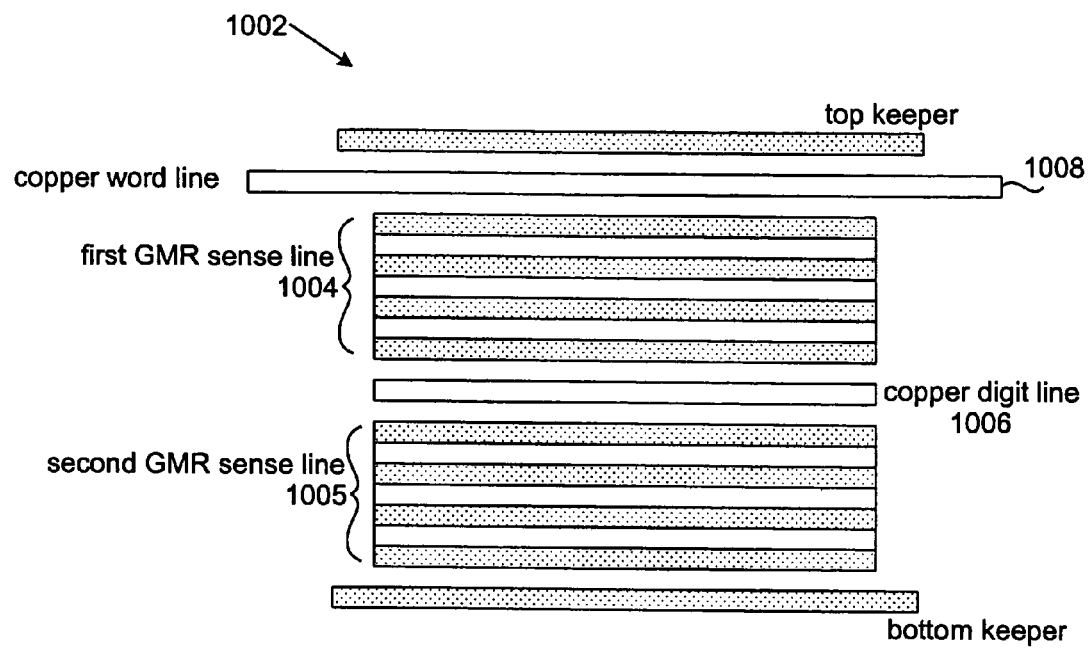
FIG. 10 shows a quad bit memory cell designed according to a further embodiment of the invention.

A quadruple-density stacked memory cell 1002 designed according to another embodiment of the present invention is shown in FIG. 10. Memory cell 1002 includes two GMR film structures 1004 and 1005 which function as sense lines of the cell. According to a specific embodiment of the invention, each of structures 1004 and 1005 is designed similarly to the GMR film structure 804 shown in FIGS. 8, 9(a) and 9(b). That is, the embodiment shown in FIG. 10 stacks two of the single GMR structure of dibit memory cell 802 of FIG. 8 to effect storage of 4 bits of information NDRO or 8 bits DRO.

As with dibit cell 802, the four bits of information of quadbit cell 1002 are stored in the two center cobalt layers of each of sense lines 1004 and 1005. The fields on the top and bottom data bit layers of sense line 1004 will be denoted $H_1$ and $H_2$, respectively. The fields on the top and bottom data bit layers of sense line 1005 will be denoted $H_3$ and $H_4$, respectively. The term k will be used to represent the constant of proportionality between the magnetic field and current on the surface of a stripline having the width of those in the memory (k=2π Oe/ma for a line 1 micron wide, and is inversely proportional to the width of the stripline). The current in top sense line 1004 will be denoted $i_1$. The current in copper digit line 1006 will be denoted $i_2$. The current in bottom sense line 1005 will be denoted $i_3$. Using these definitions, the four fields at the four information storage layers are given by:

$$H_1 = k(i_1/3 + i_2 + i_3) \quad (5)$$

$$H_2 = k(-i_1/3 + i_2 + i_3) \quad (6)$$

$$H_3 = k(-i_1 - i_2 + i_3/3) \quad (7)$$

$$H_4 = k(-i_1 - i_2 - i_3/3) \quad (8)$$

NDRO quadbit cell 1002 has the same control electronics for each of its two sense lines 1004 and 1005 as sense-digit line 804 of dibit cell 802, i.e., low level gates and preamps. From equations 5–8, it can be seen that each of the four information storage layers of quadbit cell 1002 may be written independently of the others by the appropriate combination of coincident current pulses in sense lines 1004 and 1005, digit line 1006 and word line 1008.

The read and write techniques described above with reference to dibit memory cell 802 of FIG. 8 may also be used to read the information stored in NDRO quadbit memory cell 1002. So, for example, a read would begin with measurement of the resistance of the sense line of which the storage layer of interest is a part. A particular logic state, e.g., a "1", is then written to the outside cobalt layer nearest the storage layer of interest, i.e., the outside layer is magnetized in a specific direction. The resistance of the sense line is then measured and compared to the resistance prior to the first pulse. If there is a change in resistance, the bit value of the inner storage layer is determined from a comparison of the two resistance measurements. That is, if a "1" was written to the outside layer and a positive change in the resistance of the sense lines is measured, then the inner layer is storing a "0", i.e., magnetized antiparallel to the outer layer; if a negative resistance change is measured, then the inner layer is storing a "1". On the other hand, if there is no change after the first pulse, then the opposite logic state, e.g. a "0", is written to the outside film, the resistance of the sense line is again measured, and the bit value is determined from a comparison of the three resistance measurements. That is, if the resistance change after the second pulse is positive, the inner layer is a "1", i.e., magnetized parallel to the outer layer; if the resistance change is negative, the inner layer is a "0". See FIG. 5. Note that this procedure can be used to read out all eight bits of a DRO 8-bit cell. If cell 1002 is used as an 8-bit DRO nonvolatile cell, the center copper digit line 1006 should be replaced by three layers, the top and bottom made of copper and the center a permalloy keeper.

Figure 11:
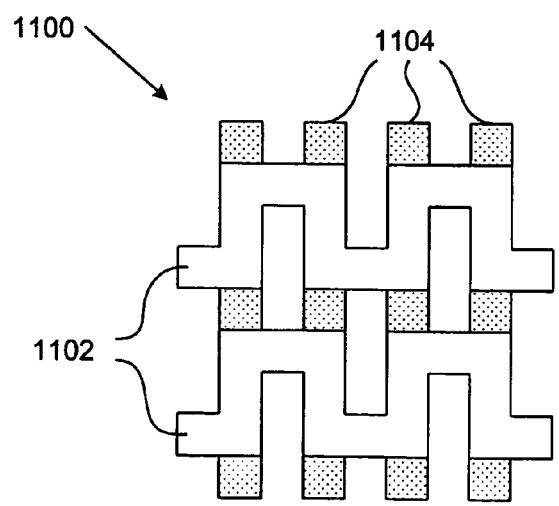
FIG. 11 is a simplified diagram of an array of memory cells designed according to the invention.

According to a specific embodiment of the present invention, various memory cells of the present invention may be configured into a memory array 1100 as shown in FIG. 11. The memory cells of the array are situated where serpentine word lines 1102 coincide with the vertical access lines 1104 which may comprise, for example, multi-layer sense-digit lines as in dibit cell 802, or separate sense and digit lines as in quadbit cell 1002.

According to other embodiments, the bit density of the dibit and quadbit memory cells of the present invention may be further doubled by changing the shape of the word lines in an array 1100 of such devices and using separate sense and digit lines. This may be understood with reference to FIGS. 12(a) and 12(b). According to such embodiments word lines 1202 are straight and orthogonal to separate sense and digit lines (1204 and 1206, respectively). FIG. 12(b) shows a dibit cell embodiment. However, it will be understood that the same principle may be applied to a quadbit cell embodiment.

Figure 12A:
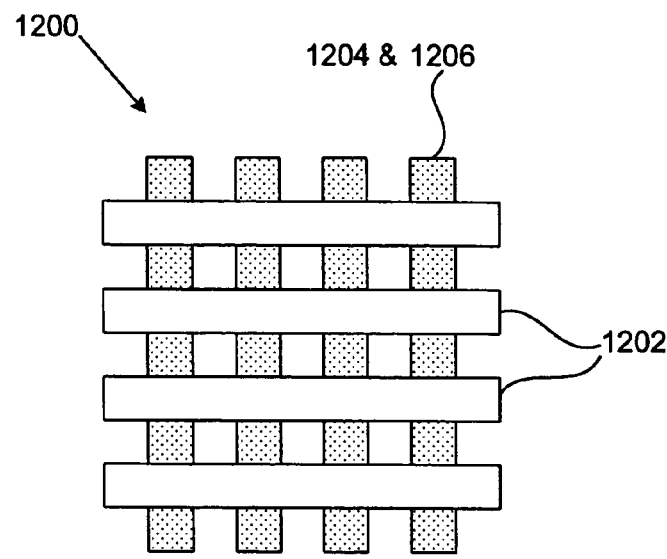
FIG. 12(a) is a simplified diagram of another array of memory cells according to another embodiment.
Figure 12B:
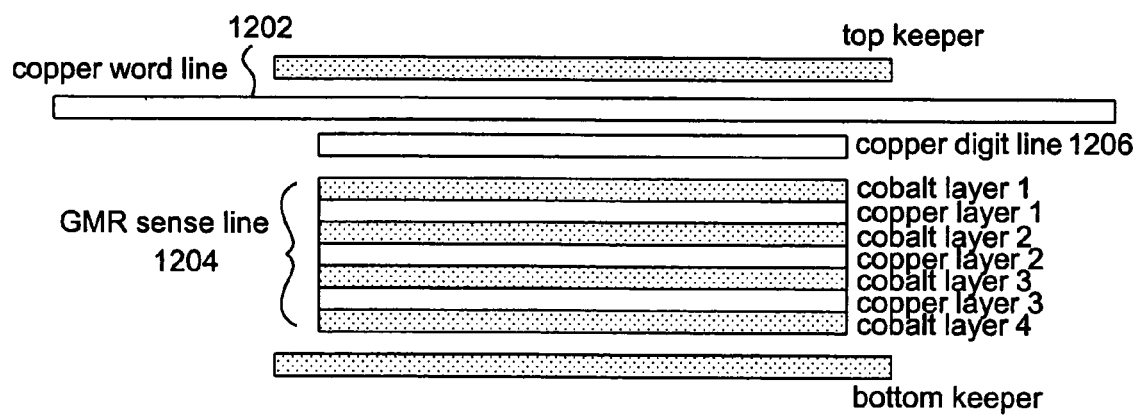
FIG. 12(b) shows yet another dibit memory cell designed according to the invention.

As can readily be seen by comparing the array design of FIGS. 11 and 12(a), the spacing between the word lines in array 1200 is decreased by a factor of two as compared to array 1100 with an attendant twofold increase in bit density. It should be noted that although the field from the word lines in array 1200 is perpendicular to the film easy axis, this field lowers the switching threshold of the cells beneath it with the result that only the portions of the magnetic films under an activated word line get switched. This enables one to switch one and only one bit in a given sense line.

Referring back to FIG. 1, the support electronics which provide random access to each of memory cells 102 are implemented with the GMR-based device referred to herein as a "transpinnor." A transpinnor is a multifunctional, active GMR device with characteristics similar to both transistors and transformers. Like a transistor, it can be used for amplification, logic, or switching. Like a transformer, the transpinnor can be used to step voltages and currents up or down, with the input resistively isolated from the output. Like a transistor, a transpinnor can be integrated in a small space. Unlike conventional transformers, a transpinnor has no low frequency cutoff, the coupling being flat down to and including DC. In addition, the operational characteristics of the transpinnor (including amplification, current requirements, and speed) tend to improve as its dimensions get smaller. For more information on transpinnors, please refer to U.S. Pat. Nos. 5,929,636 and 6,031,273 for ALL-METAL, GIANT MAGNETORESISTIVE, SOLID-STATE COMPONENT, the entire disclosures of which are incorporated herein by reference for all purposes.

Figure 13:
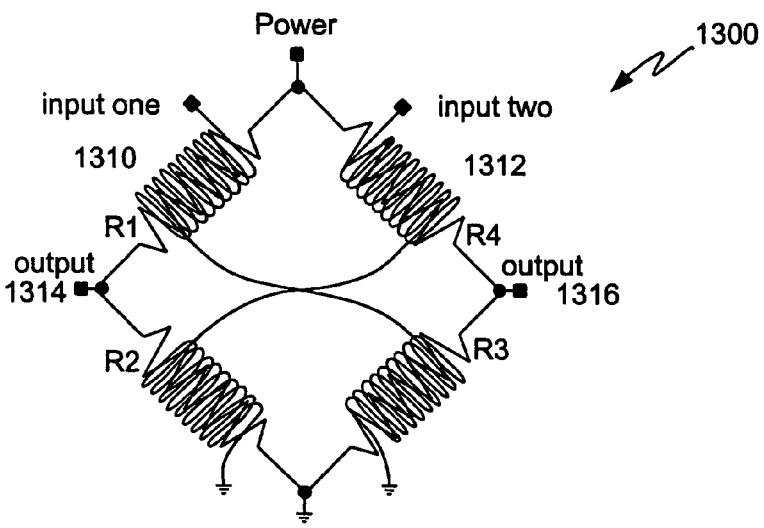
FIG. 13 is a simplified circuit diagram of a transpinnor for use with specific embodiments of the present invention.

A specific implementation of a transpinnor 1300 is shown in FIG. 13. Four resistive elements $R_1$–$R_4$ comprising GMR film structures are configured as a Wheatstone bridge. Current in either of input lines 1310 or 1312 creates a magnetic field of one or more of GMR films $R_1$–$R_4$. This unbalances the bridge and creates an output signal between output terminals 1314 and 1316. In the transpinnor implementation of FIG. 13 input lines 1310 and 1312 are shown magnetically coupled (i.e., no electrical or resistive coupling) to resistive elements $R_1$–$R_4$ with coils. According to other integrated circuit embodiments, this coupling is achieved using striplines.

As mentioned above, the resistance of each leg of transpinnor 1300 may be changed by application of a magnetic field to manipulate the magnetization vectors of the respective GMR film's layers. Such fields are generated by the application of currents in input lines 1310 and 1312 which are electrically insulated from the GMR films. Input line 1310 is coupled to and provides magnetic fields for altering the resistance of GMR films $R_1$ and $R_3$. Input line 1312 is coupled magnetically to and provides magnetic fields for altering the resistance of GMR films $R_2$ and $R_4$. If the resistances of all four GMR films are identical, equal currents in input lines 1310 and 1312 change the resistances equally and do not unbalance the bridge, thus resulting in zero output. If, however, unequal currents are applied, an imbalance results, thus resulting in a nonzero output.

Figure 14:
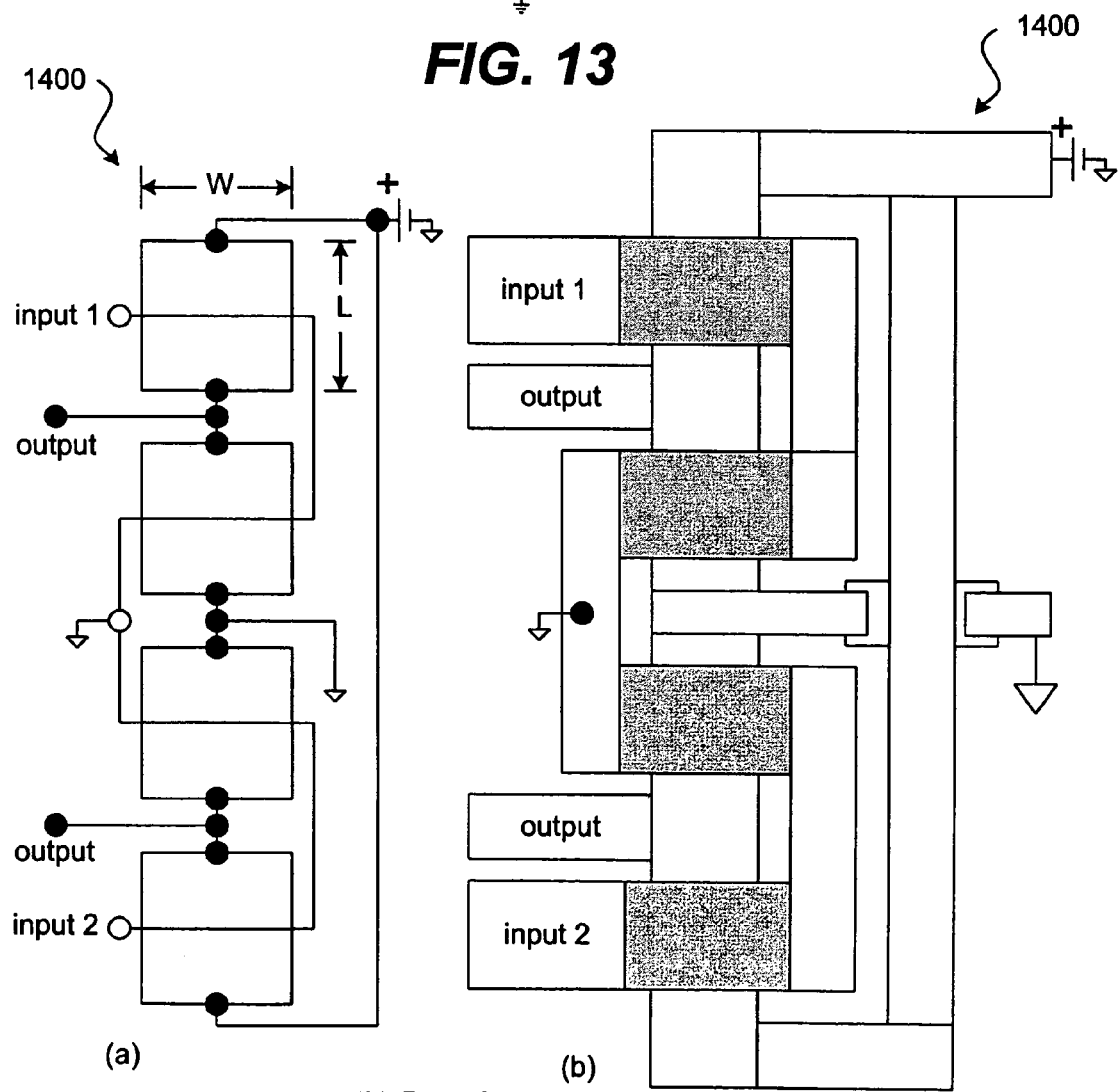
FIGS. 14(a) and 14(b) are simplified representations of a differential transpinnor for use with specific embodiments of the present invention.

FIG. 14 shows a circuit diagram (a) and an integrated circuit layout (b) of an integrated circuit implementation of a differential transpinnor 1400 for use with specific embodiments of the present invention.

The relationship between the output voltage of transpinnor 1300 and a variety of other parameters including power supply voltage, input current, GMR value, leg resistance values, and output resistance will now be described. This analysis assumes the ideal case where the resistance of each of four resistive elements $R_1$–$R_4$ (when in identical magnetic states) is identical, and denotes this resistance value as r. When a positive current is applied at input 1 and a negative current is applied at input 2, the various resistances are given by:

$$R_1 = r(1-\delta) \quad (9a)$$

$$R_2 = r(1+\delta) \quad (9b)$$

$$R_3 = r(1-\delta) \quad (9c)$$

$$R_4 = r(1+\delta) \quad (9d)$$

Where $$\delta = f(H) gmr/2 \quad (10)$$

gmr is the decimal equivalent of GMR (i.e., gmr=GMR/100), and f(H) is a number less than or equal to one, representing the fraction that a layer has switched.

The output resistance of transpinnor 1300 is denoted $r_5$. The current in each of resistive elements $R_1$–$R_4$ and $r_5$ denoted $i_1$–$i_5$, respectively. The voltage drop across the entire bridge, i.e., the voltage applied to the power lead) is denoted V. From Kirchoff's laws we then have $$i_1 - i_2 - i_5 = 0 \quad (11a)$$

$$i_4 - i_3 + i_5 = 0 \quad (11b)$$

and from symmetry, $$i_1 = i_3 \quad (12a)$$

$$i_2 = i_4 \quad (12b)$$

Because the voltage drop over any path between the power lead and ground must be V, $$(1-\delta)ri_1 + (1+\delta)ri_2 = V \quad (13)$$

$$(1-\delta)ri_1 + i_5 r_5 + (1-\delta)ri_1 = V \quad (14)$$

Combining equations (11), (13), and (14), $$i_5 = 2i_1\delta/[1+\delta(r_5/r)] \quad (15a)$$

This equation represents the output current of transpinnor 1300.

Also of interest is the dependence of the amplification factor, $$A = \text{output current/input current} \quad (16)$$

on the power supply to transpinnor 1300 and the line width of the GMR films. For this analysis will use the approximation that $r_5/r \ll 1$. This is due to the fact that the input and output lines of transpinnor 1300 are much thicker than the GMR films (e.g., 20 nm of copper and 300 nm of AlCu vs. 2–4 nm of copper). In addition, $\delta \ll 1$ also (see equation 10). In the case of complete switching, equation 15a then becomes $$i_5 = 2i_1\delta = i_1 \, gmr \quad (15b)$$

The input current must be sufficient to switch the lower coercivity, e.g., permalloy layer of the GMR films, i.e., sufficient to produce a magnetic field equal to the layer coercivity, $H_C$. The field H produced by a current i in a stripline of width w and length L is found from Maxwell's equation, curl H=J', to be $$H = 2\pi i/w \text{ Oe} \quad (17)$$

where i is in mA and w is in microns. (In changing units from Maxwell's equation to those in equation (17) it should be noted that $4\pi$ Oe$=10^3$ amps/meter.) Thus, the input current required to produce a field $H_c$ is $$\text{input current} = (1/2\pi) H_c \, w \text{ mA/(Oe–micron)} \quad (18)$$

To derive the output current, it should be noted with reference to FIG. 13 that the power voltage V is applied to $R_1$ and $R_2$ in series, and that because $i_5$ is small, the current in resistive elements $R_1$ and $R_2$ can be approximated as $i_1$. Thus, the current $i_1$, according to Ohm's law, is the ratio of V (in volts) to the sum of $R_1$ and $R_2$, or 2r (in ohms). So, $i_1 = 10^3 V/(2r)$ mA, and therefore according to equation (15b) the output current is $$\text{output current} = 10^3 \, gmr \, V/(2r) \text{mA} \quad (19)$$

The amplification factor is then $$A = \pi 1000 \, gmr \, V/(r \, H_C w) \quad (20a)$$

It is further useful to write the resistance r as the sheet resistivity, $R_{sq}$ (ohms per square) multiplied by the number of squares. The number of squares of one of the GMR resistive elements of FIG. 14 is L/w. Thus, the amplification may be written $$A = \pi 1000 \, gmr \, V/(H_C L R_{sq}) \quad (20b)$$

where $H_C$ is in Oe, and w and L are in microns.

As discussed above, transpinnors form the basis for the all-metal support electronics for memory 100 of FIG. 1. That is, transpinnors are used to select the word lines to be activated (104), select the sense-digit and reference lines to activated (106), regulate the voltage to the drive lines (108), amplify the difference in current between selected sense-digit and reference line pairs (110), and perform further sense amplification in successive stages.

It turns out that the transpinnor is extremely effective for applications in which a physical signal is to be read above an offset arising from the difference between two unevenly matched input lines. It functions as a transformer at its input, rejecting the common-mode signal between the two lines, and as a differential amplifier at its output, amplifying the physical signal. In memory 100 there is a differential transpinnor 110 coupled to each sense-digit/reference line pair such that the sense-digit line is connected to input 1 of the transpinnor and the corresponding reference line is connected to input 2 (see FIGS. 13 and 14). As discussed above, inputs 1 and 2 of each transpinnor are only magnetically coupled (i.e., no electrical or resistive coupling) to its GMR film resistive elements, the input being DC isolated from the output.

When the sense-digit and reference lines of a pair are in the same magnetic state, the output of the differential transpinnor 110 should be zero. However, because of imperfections arising in the fabrication process, the resistance of a sense-digit line will typically be different than that of its reference line. Consequently, when the same voltage is applied to the two lines, different currents enter the two inputs of the associated differential transpinnor 110 causing a nonzero output, and thus the potential for error. According to a specific embodiment of the present invention, the differential transpinnor 110 for each sense-digit/reference line pair may be trimmed to compensate for this imbalance.

That is, compensation for the resistive imbalance is achieved by reducing the output of the transpinnor through at least partial reversal of one of the high coercivity, i.e., cobalt, layer. According to a specific embodiment, the other side of the transpinnor is operated with the high coercivity layer(s) saturated. The low coercivity layer(s) remains free to react to the input current, thereby producing the dynamic output. By reversing just the right percentage of the cobalt layer, the output of the transpinnor can be made to go to zero when the reference and sense-digit lines are in the same magnetic state, i.e., when it is supposed to be zero.

Equation (15b) represents the case where the currents of inputs 1 and 2 are equal in magnitude and of opposite polarity. When the currents are of the same polarity and different magnitude, the equation becomes $$i_s = i_1(\delta_1 - \delta_2) \quad (21)$$

Since the two fractional resistance changes are unequal, $i_s$ is nonzero. In equation (10), f(H) is the fraction of the film for which the magnetization of the high coercivity layer and the low coercivity layer (i.e., the cobalt layer and the permalloy layer) are antiparallel less that for which they are parallel. We can therefore write f(H) as the product of two terms, one representing the high coercivity layer and one representing the low coercivity layer, $$f(H) = f_c(H) f_p(H) \quad (22)$$

where $f_c(H)$ is the fraction of the cobalt layer magnetized in the positive direction less that magnetized in the negative direction and $f_p(H)$ is the corresponding fraction for the permalloy layer. This assumes that the layers switch independently of one another which is a reasonable assumption in that the coercivity of cobalt is much higher than that of the permalloy, and the transpinnor is typically operated at low field where only the magnetization of the permalloy changes and that of the cobalt remains fixed. That is, $$f_c(H) = \text{constant} \quad (23)$$

but the values of $f_c(H)$ will in general be different for the two inputs.

The transpinnor can be set up so that the response of the permalloy to the applied field (from the current in the input line) is relatively linear for the current range of interest, i.e., $$f_p = kI |f_p| < 1 \quad (24)$$

where the value of the proportionality constant k is determined by the shear of the loop. Denote the current from the reference line by $i_{ref}$ and the current from the sense-digit line by $i_{sense}$. Then $$\delta_1 = f_{c1} f_p gmr/2 = f_{c1} k \, i_{sense} gmr/2 \quad (25)$$

$$\delta_2 = f_{c2} f_p gmr/2 = f_{c2} k \, i_{ref} gmr/2 \quad (26)$$

Then, by equations (21), (25), and (26), the output current $i_s$ of the transpinnor is given by $$i_s = i_1(\delta_1 - \delta_2) = i_1 k (gmr/2)(f_{c1} i_{sense} - f_{c2} i_{ref}) \quad (27)$$

Equation (27) reveals that even if the sense current is different than the reference current when the line are in the same magnetic state, the output current $i_s$ can be made zero by adjusting the magnetization in the cobalt film. Thus, for example, if the current in a sense-digit line is greater than that in the corresponding reference line, the currents can be balanced by saturating the cobalt in the reference leg of the transpinnor in the positive direction so that $f_{c2} = 1$ and partially reversing the cobalt in the sense-digit leg of the transpinnor such that $f_{c1} = i_{ref}/i_{sense}$. This balances the input, even though the lines have different resistances. The adjustment is facilitated by the fact that the two cobalt layers can be adjusted independently. It should be noted that this technique can compensate for virtually any resistive inequality in a given sense-digit/reference line pair. This is even the case where the difference in resistance is much greater than the films' gmr values.

According to various specific embodiments of the present, there are a number of ways in which a transpinnor may be connected to a sense-digit/reference line pair. Four of these options will now be described with reference to FIG. 15. Each option is shown using coils. However, it will be understood that the present invention contemplates analogous embodiments using striplines. In addition, for the purpose of clarity, each of the embodiments is shown with only the transpinnor's input lines, i.e., omitting the resistive elements.

FIG. 15(a) shows the input lines 1502 and 1504 of a transpinnor configured such that each of the transpinnor's four resistive elements (not shown) is influenced by current from both sense-digit line 1506 and reference line 1508. In the figure this is shown as the coils being configured concentrically with the coils slightly displaced from one another. In a stripline embodiment, the input lines would be striplines deposited on top of the other layers with insulation in between. This configuration has the highest sensitivity for differential amplification of the four shown, but has relatively low sensitivity for trimming unless the overlap of the input lines is only partial.

FIG. 15(b) shows input lines 1512 and 1514 of a transpinnor configured such that the current from sense-digit line 1516 goes through only input line 1512 which supplies magnetic fields to two of the transpinnor's resistive elements, while current from reference line 1518 goes through only input line 1514 which supplies magnetic fields to the other two resistive elements of the transpinnor. Transpinnor 1300 of FIG. 13, for example, is configured for such a connection.

FIG. 15(c) shows input lines 1522 and 1524 of a transpinnor connected in series between the midpoints of sense-digit line 1526 and reference line 1528. In this configuration, the current flowing through the two input lines is proportional to the difference in resistance between them.

FIG. 15(d) shows input line 1532 coupled between sense-digit line 1536 and reference line 1538. Input line 1534 is used to compensate for any intrinsic difference in resistance between them, i.e., to eliminate any offset. This configuration is the least sensitive of the four shown for differential amplification.

Figure 15:
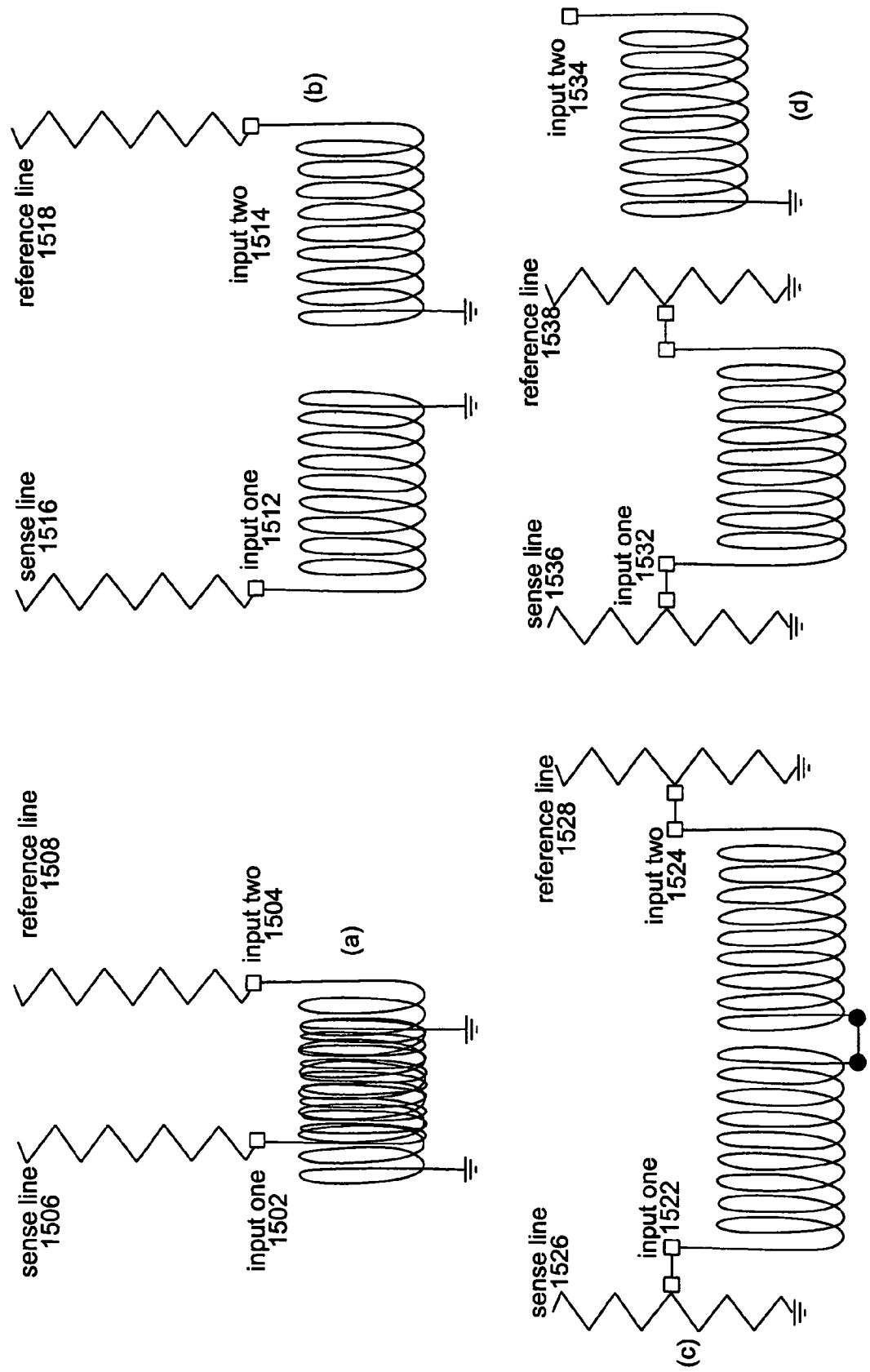
FIGS. 15(a)–15(d) illustrate four different embodiments in which a transpinnor is used to balance a sense-digit/reference line pair.

The four configurations of FIG. 15 lead to four different methods of using transpinnors for resistive trimming.

A differential transpinnor exhibits hysteresis unless operated in a specific way. This hysteresis can be avoided if the transpinnor is biased in the hard direction of the low coercivity (e.g., permalloy) layer with a field greater than or equal to the anisotropy field. This eliminates the hysteresis and the permeability becomes very large. The high coercivity (e.g., cobalt) layer is largely unaffected because its anisotropy field is typically much larger than that of the low coercivity layer. The signal field is applied by the input lines of the transpinnor and is in the easy-axis direction.

A second method which requires no bias field is to fabricate the transpinnor with the easy axis of the low coercivity layer perpendicular to the easy axis of the high coercivity layer. The low coercivity layer thus undergoes uniform magnetization rotation rather than wall-motion switching.

A third method of dealing with transpinnor hysteresis is to initialize the transpinnor the same way before each read operation. For example, each read operation could be started by the application of a negative pulse which switches all the low coercivity layers but not any of the high coercivity layers. This erases any previous low coercivity layer history.

According to a fourth method, the low coercivity layer of the transpinnor is initialized antiparallel to the high coercivity layer, leaving it on the very steep part of the device's hysteresis curve where a small input current will produce a large output.

According to a specific embodiment of the invention, when a transpinnor is used to balance a sense-digit line against its reference line, the resistive elements of the transpinnor are adjusted such that when the sense-digit and reference lines are in identical magnetic states (i.e., with the same number of ones and zeros in the storage layers of the two lines and at the corresponding locations in each, and with the same corresponding magnetizations in the readout layers of the two lines), the transpinnor gives zero output. When a bit is changed on the reference line but not the sense-digit line, the ratio of resistances changes and the transpinnor gives a nonzero output. That is, the transpinnor is adjusted to give zero output not when both input currents are equal, but when the sense-digit line and the reference line are in the same magnetic state. Note that the voltages applied to the two lines are equal, but because the resistances are unequal, the currents in the lines are unequal. Thus, though the supply to the line pair is a constant current, the individual currents in the pair may be different.

During a read operation, the read current through the trimming transpinnor is large enough to switch its low coercivity layer, but not its high coercivity layer. Therefore, the trimming adjustment is made to the high coercivity layer (which remains in the partially switched state during the read operation), not the low coercivity layer (which needs to be free to change in response to the read current). The high coercivity layer in the transpinnor is not affected by write operations because the resistive elements of the transpinnors are not physically connected to the sense-digit lines.

FIGS. 16(a)–16(e) illustrate the effect of the trimming technique of the present invention on the balancing of sense-digit/reference line pairs according to a specific embodiment thereof. Each set of three diagrams corresponds to a transpinnor with specific characteristics. In each set the left most diagram represents the transpinnor output, the middle diagram the output from read signal for a "1," and the right most diagram the output from a read signal for a "0."

When the transpinnor associated with a particular sense-digit/reference line pair is well balanced, i.e., the sense-digit line and the reference line have equal resistances, the outputs for a "1" and a "0" are as shown in FIG. 16(a). When the resistance of the sense-digit line is smaller than that of the reference line, the result is an input current offset represented by the vertical dashed line in FIG. 16(b). The creates the "pedestal" of FIG. 16(b) as a result of which the output for a "0" can be mistaken for that of a "1." If, however, a prep pulse of the appropriate magnitude is applied, the response curve of the transpinnor is shifted as shown in FIG. 16(c), as a result of which the pedestal of FIG. 16(b) is removed.

Similarly, if the resistance of the sense-digit line is greater than that of its corresponding reference line, the result is a pedestal of the opposite polarity as illustrated in FIG. 16(d). This pedestal may also be eliminated by the application of a prep pulse of the appropriate magnitude which moves the response curve of the transpinnor to the left as shown in FIG. 16(e).

Figure 16:
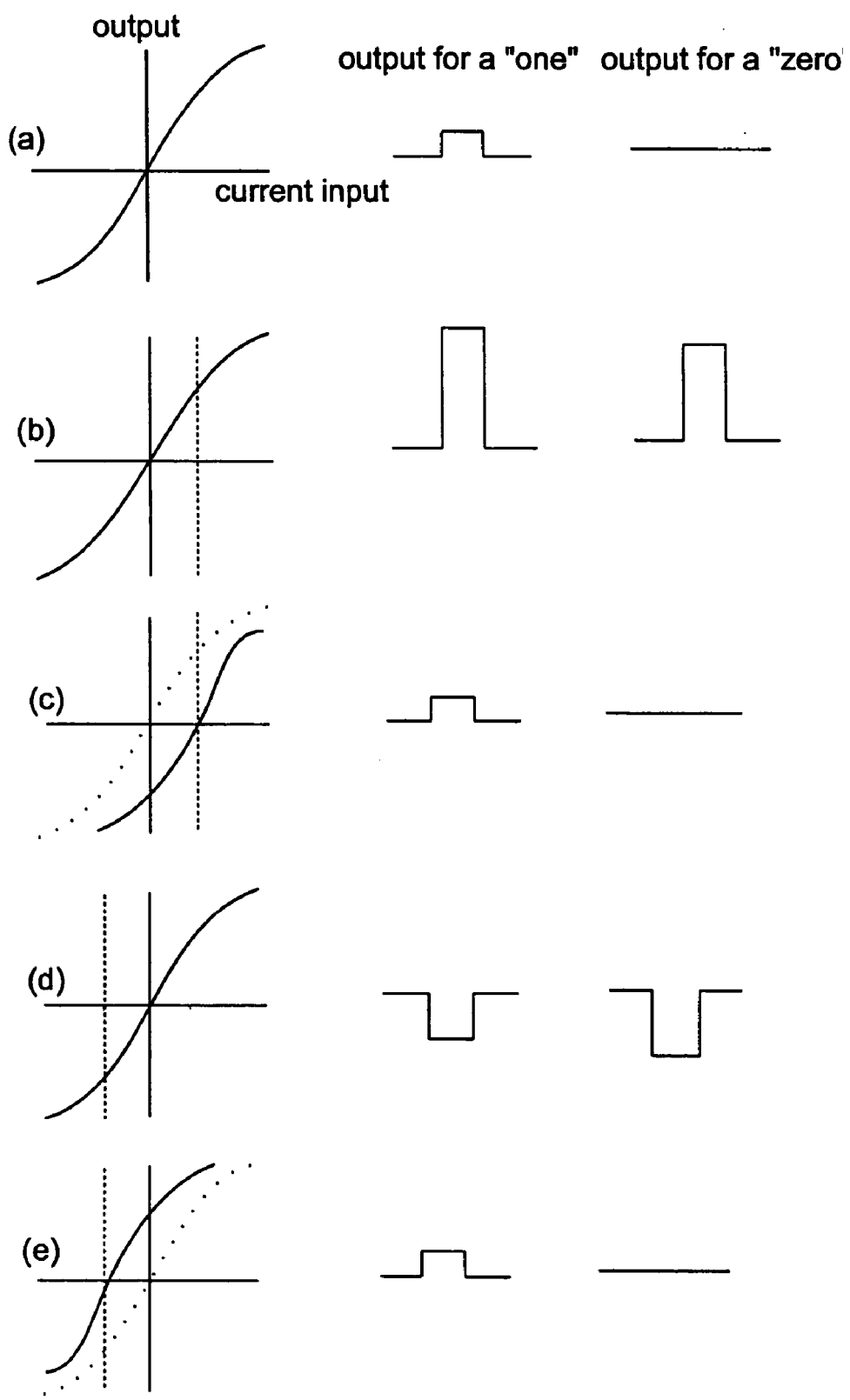
FIGS. 16(a)–16(e) illustrate the effect of the trimming technique of the present invention on the balancing of sense-digit/reference line pairs.

It will be understood with reference to the diagrams of FIG. 16 that by properly balancing a transpinnor coupled to a sense-digit/reference line pair, the additional steps otherwise required for removing the read operation pedestal may be eliminated and the read time correspondingly reduced.

Referring once again to FIG. 1, three types of GMR structures are shown working together to create an operational all metal random access memory or SpinRAM 100. As discussed above, memory cells 102 comprise multi-layer thin film elements each of which stores one or more bits of information. Word and sense-digit selection electronics (104 and 106) and amplifiers 110 comprise transpinnors. Trim resistors 108 are provided for regulating the current to the memory access lines and comprise GMR films the resistance of which may be trimmed by controlling the percentage switching of the films' high coercivity layers (as discussed above with regard to the balancing of a transpinnor).

According to specific embodiments, it is desirable that the GMR films for each of the SpinRAM memory elements 102 have high GMR values to achieve a favorable signal-to-noise ratio. Relatively low coercivities may also be desirable for both the high and low coercivity layers of the memory elements to ensure low switching currents, although the difference in coercivity between the high and low coercivity layers should be sufficiently large to maintain satisfactory operating margins.

The characteristics of the GMR films for the transpinnor-based elements (i.e., 104, 106, and 110) may be similar to those discussed above for the memory elements, but may differ in some respects. That is, like the memory elements, high GMR values are desirable, as is a relatively low coercivity for the low coercivity layers. However, the coercivity of the high coercivity layers can be significantly larger than that which would be acceptable for the corresponding layers of the memory elements. In addition, it is desirable that the GMR values and coercivities of the layers of GMR resistors 108 be relatively high to ensure stability.

A simplified schematic of a transpinnor-based selection matrix is shown in FIG. 17. FIG. 17(a) shows a word line selection matrix 1700 the design for which, it will be understood, may also be used as a sense-digit line selection matrix. It will also be understood that although the embodiment shown selects from among 256 word lines, many variations of the size of the selection matrix remain within the scope of the invention.

At each intersection of a power current line 1702 and a transpinnor selection line 1704 is a transpinnor 1706 which delivers current to a selected word (or sense-digit) line 1708. A simplified representation of a transpinnor 1706 is shown in FIG. 17(b). The input selection line 1704 is shown coupled to the individual GMR resistive elements via a plurality of coils in FIG. 17(b) for didactic reasons. It will be understood, however, that the input selection line is fabricated as a stripline in integrated circuit embodiments. At the output of each transpinnor 1706 is one of 256 word (or sense-digit) lines 1708. According to a specific embodiment, the configuration of selection matrix 1700 is advantageous in that power need only be supplied to one column of transpinnors (i.e., the one corresponding to a selected word line) at one time. Transpinnors 1706 function as the gates of selection matrix 1700, a particular word or sense-digit line being selected in the following manner.

A power current is applied to the column of transpinnors 1706 which includes the transpinnor corresponding to the line 1708 to be selected via one of power current lines 1702. Power being applied to each resistively balanced transpinnor results in zero output. As discussed above, individual transpinnors may be balanced to achieve this zero output using the technique referred to herein as magnetoresistive trimming. Exemplary trimming techniques which may be employed with various embodiments of the invention are described in U.S. Pat. No. 6,469,927 for MAGNETORESISTIVE TRIMMING OF GMR CIRCUITS issued on Oct. 22, 2002, the entire disclosure of which is incorporated herein by reference for all purposes.

Coincident with the application of the power current, a current is transmitted via the input selection line 1704 corresponding to the transpinnor 1706 to be selected. The field associated with this current unbalances the selected transpinnor by at least partially reversing the magnetization of at least one of the transpinnor's low coercivity layers, and thereby changing the resistance of the corresponding GMR element. The transpinnor imbalance results in a corresponding output current which is delivered to the memory array via the word (or sense-digit) line 1708 connected to the transpinnor output.

Most computer systems are based on the use of volatile main memory which is typically implemented using dynamic random access memory (DRAM) technology. The volatile nature of DRAM and its relatively high cost per bit of storage capacity has, in turn, led to the development of magnetic disk technology as the basis for the permanent mass storage component of computer memory systems. This hybrid architecture has some well known disadvantages which include, among other things, the relatively long access time for magnetic disks, increased operating system complexity, and the risk of data loss during power failures.

The block diagram of FIG. 18 shows a generalized computer memory hierarchy associated with a microprocessor 1802. Several types of memory technologies which serve a variety of functions are employed. A high performance primary cache 1804 is integrated with microprocessor 1802. A secondary cache 1806 is also provided. Cache memories are usually small (e.g., 256K), power hungry SRAM devices. They greatly enhance system performance by providing the microprocessor with a small block of information which may be accessed at speeds rivaling the speed of operation of the microprocessor itself. Storing a small block of data in cache memory allows most microprocessor requests (e.g., >90%) to be filled at SRAM speeds (e.g., 10 ns).

If a requested piece of information is not present in the cache, the information must be retrieved from main memory 1808. Main memory 1808 communicates with microprocessor 1802 via memory interface 1810, is typically much larger (e.g., 16M) and slower (e.g., access times of 70 ns) than cache memory, and is typically implemented in DRAM. This main memory provides microprocessor 1802 with relatively fast access to large blocks of data as well as stores and streams data to the display.

If a requested piece of information is not present in main memory, the information must be retrieved from mass storage. Such mass storage may be provided by one or more magnetic disks 1812 which are coupled to microprocessor 1802 via disk controller 1814 and I/O bus 1816 which may be, for example, an ISA, EISA, PCMCIA, PCI, or CompactPCI bus. The typical storage capacity of such magnetic disk technology is on the order of gigabytes, but the access times are orders of magnitude slower than the other levels of the memory hierarchy (e.g., 12 ms).

The present invention provides an architecture in which each of the memories outside of microprocessor 1802 may be implemented with the all-metal giant magnetoresistive memories described herein. This type of memory will also be referred to herein as SpinRAM®. The SpinRAM technology replacement for DRAM/FLASH is also referred to as SpinRAM2 and the replacement for rotating disk storage is referred to as SpinRAM3. SpinRAM1 is the replacement for SRAM such as that used in cache memories.

Figure 19A:
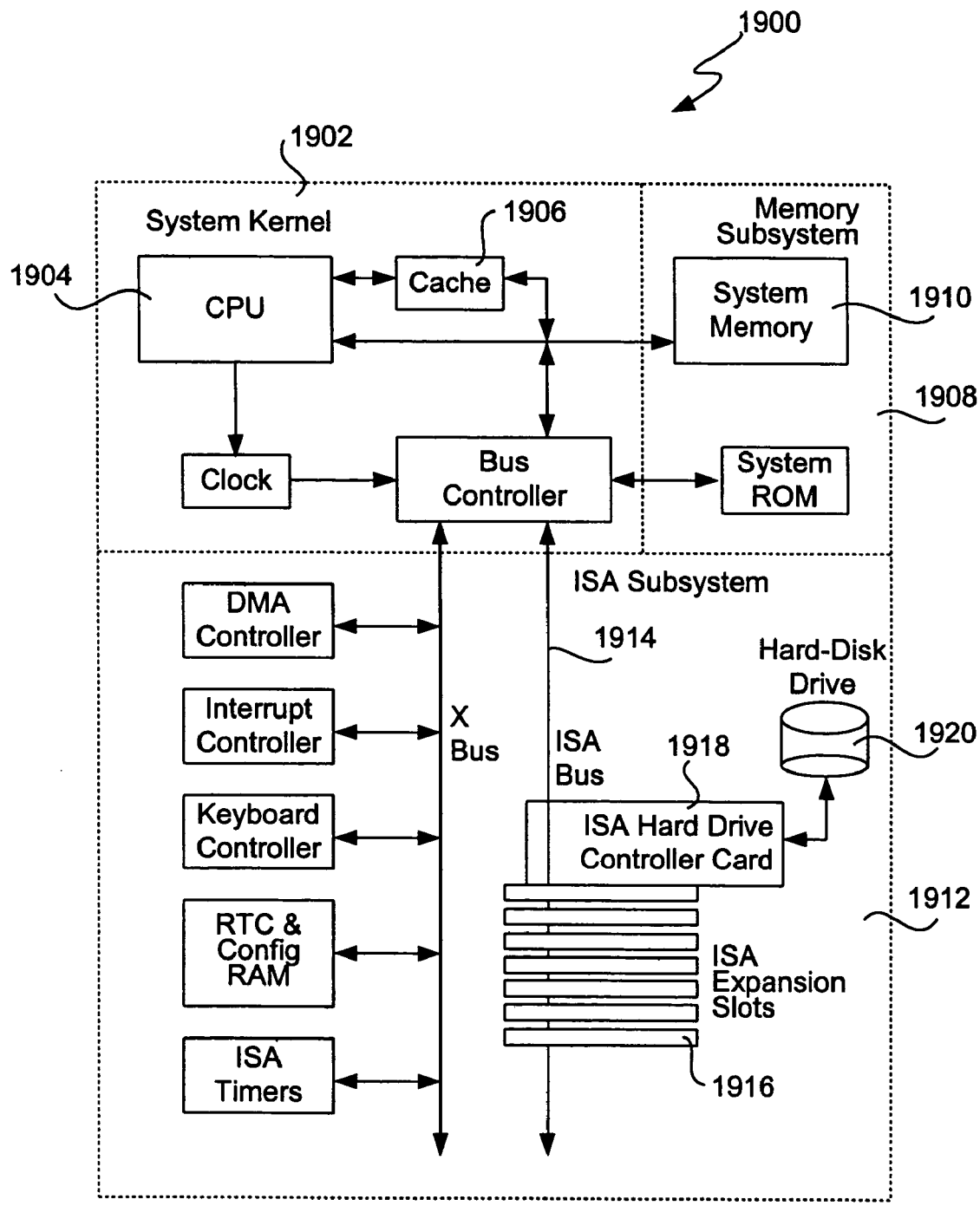
FIGS. 19(a) and 19(b) are is functional block diagrams of ISA-bus IBM compatible personal computer systems according to specific embodiments of the invention.
Figure 19B:
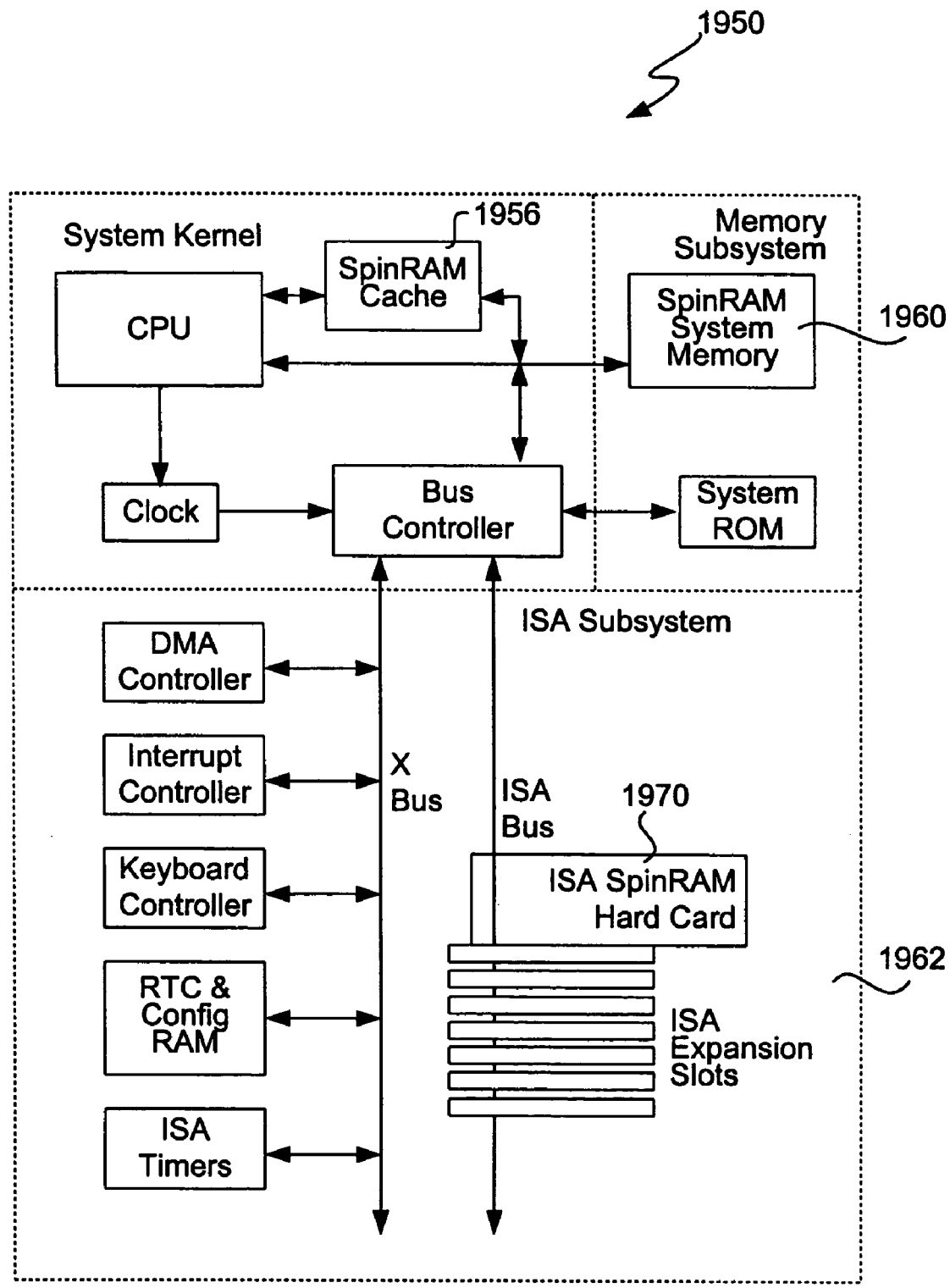

An example of a unified memory architecture designed according to a specific embodiment of the present invention will now be described with reference to FIGS. 19(*a*) and 19(*b*). FIG. 19(*a*) is a functional block diagram of an ISA-bus IBM compatible personal computer system 1900. System kernel 1902 includes CPU 1904 and cache memory 1906 which may be the CPU's primary cache or, where the CPU includes an integrated primary cache, the CPU's secondary cache. Memory subsystem 1908 includes the main system memory 1910. ISA subsystem 1912 includes an ISA bus 1914 along which are disposed ISA expansion slots 1916. At least one of the expansion slots is coupled to an ISA hard drive controller card 1918 which controls magnetic hard disk drive 1920.

FIG. 19(*b*) is a functional block diagram of an ISA-bus IBM compatible computer system 1950 having a memory architecture designed according to a specific embodiment in which the cache, system, and hard disk memories of computer system 1900 have been replaced with the all-metal giant magnetoresistive memories of the present invention. It will be understood that, although an ISA system is shown in this example, the same principles may be applied to virtually any computer system, e.g., EISA, PCI, CompactPCI, without departing from the scope of the present invention.

It should also be noted that, although all three of the cache, system and hard disk memories are replaced in this example, some other subset of these memories (e.g., just the disk drive and system memory) may be replaced by the all-metal giant magnetoresistive memory technology of the present invention without departing from the invention.

With reference to ISA subsystem 1962, ISA SpinRAM hard card 1970 replaces the disk drive and controller of system 1900. The memory architecture of SpinRAM hard card 1970 may be, for example, any of the architectures and memory designs described above with reference to FIGS. 1–17. As with other solid-state memory disk replacement schemes, this embodiment eliminates the need for both the disk and its controller card. In addition to reducing size, weight, and power consumption, SpinRAM hard card 1970 drastically reduces access time and eliminates mechanical failures. And, unlike a FLASH-based hard card solution, the memory array of SpinRAM hard card 1970 may be configured to be byte-alterable, has virtually unlimited read/write cycles, and sub-microsecond read and write times.

Figure 20:
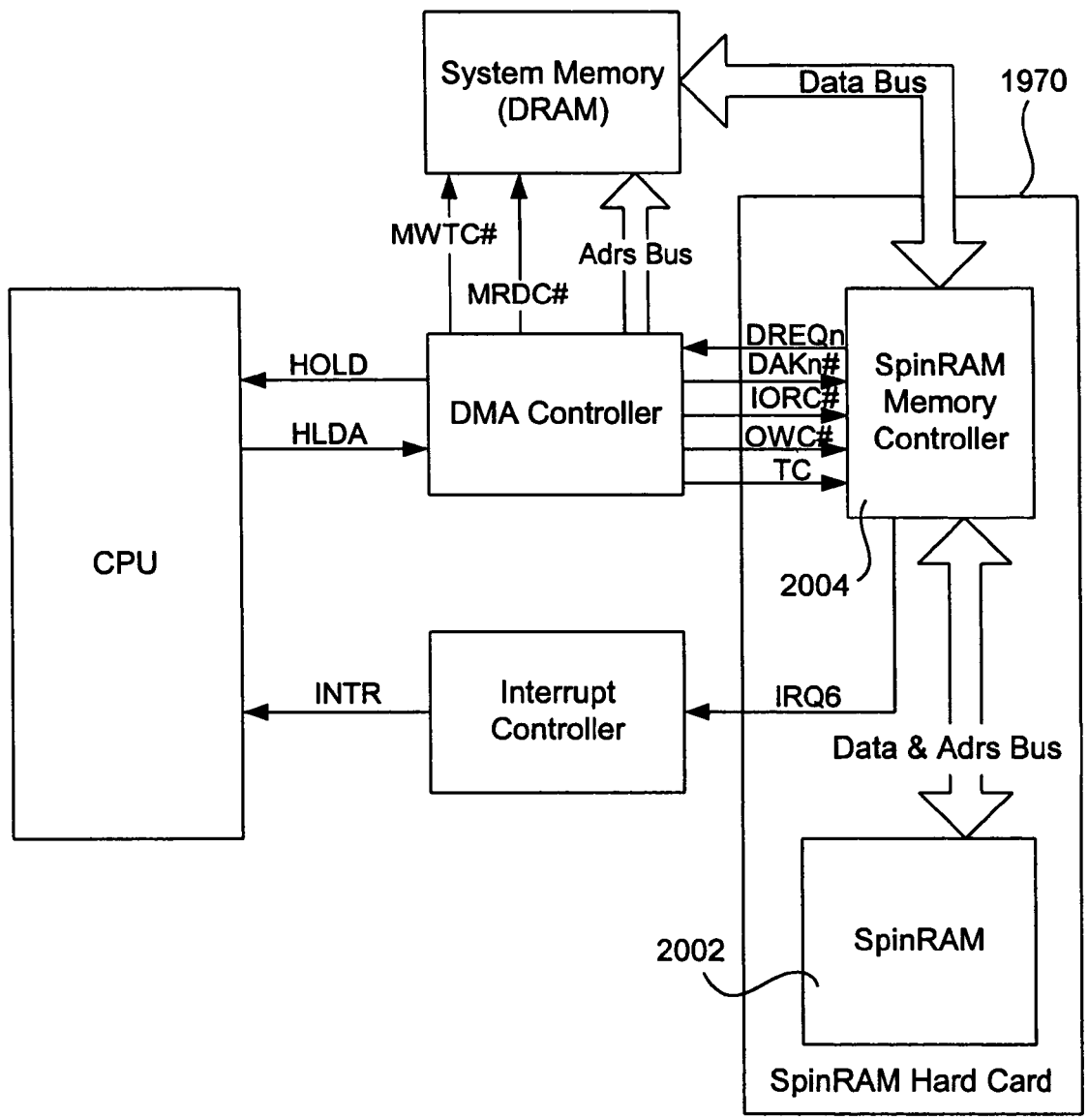
FIG. 20 is a block diagram of a specific implementation of a SpinRAM hard card in accordance with a specific embodiment of the invention.

A block diagram of a specific implementation of a SpinRAM hard card 1970 is shown in FIG. 20. SpinRAM memory array 2002 (e.g., memory 100 of FIG. 1) is controlled by SpinRAM memory controller 2004 which, according to a specific embodiment, is located on the same hard card. In PC-bus embodiments such as the ISA embodiment of FIG. 19(*b*), the bus interface of controller 2004 mimics that of a standard hard disk controller. By contrast, the memory array interface of controller 2004 does not resemble the corresponding interfaces of currently available hard disk controllers. That is, for example, unlike FLASH memories and as described above, SpinRAM technology is current controlled and random access. Controller 2004 is therefore configured to facilitate access to the memory cells to SpinRAM memory array 2002 according to the techniques described above.

The desired functionality of SpinRAM controller 2004 may be implemented, for example, by modifying an existing chip set, using discrete components, or designing a custom controller ASIC. The final interface between controller 2004 and the actual memory cells of SpinRAM array 2002 comprise module interface circuits (not shown) such as, for example, selection matrices 104 and 106 of FIG. 1. According to various embodiments and as described above with reference to the all-metal memory technology of the present invention, such module interface circuits may be fabricated on the same wafer as the memory cells themselves using the same processes. According to other embodiments, such module interface circuits may be implemented in separate integrated circuits, in which case, SpinRAM memory array 2004 could be packaged as a multi-chip module.

Referring back to FIG. 19(*b*), SpinRAM cache memory 1956 and SpinRAM system memory 1960 replace the cache and system memories of system 1900. As with SpinRAM hard card 1970, memories 1956 and 1960 may comprise any of the architectures and memory designs described above with reference to FIGS. 1–17.

Figure 21:
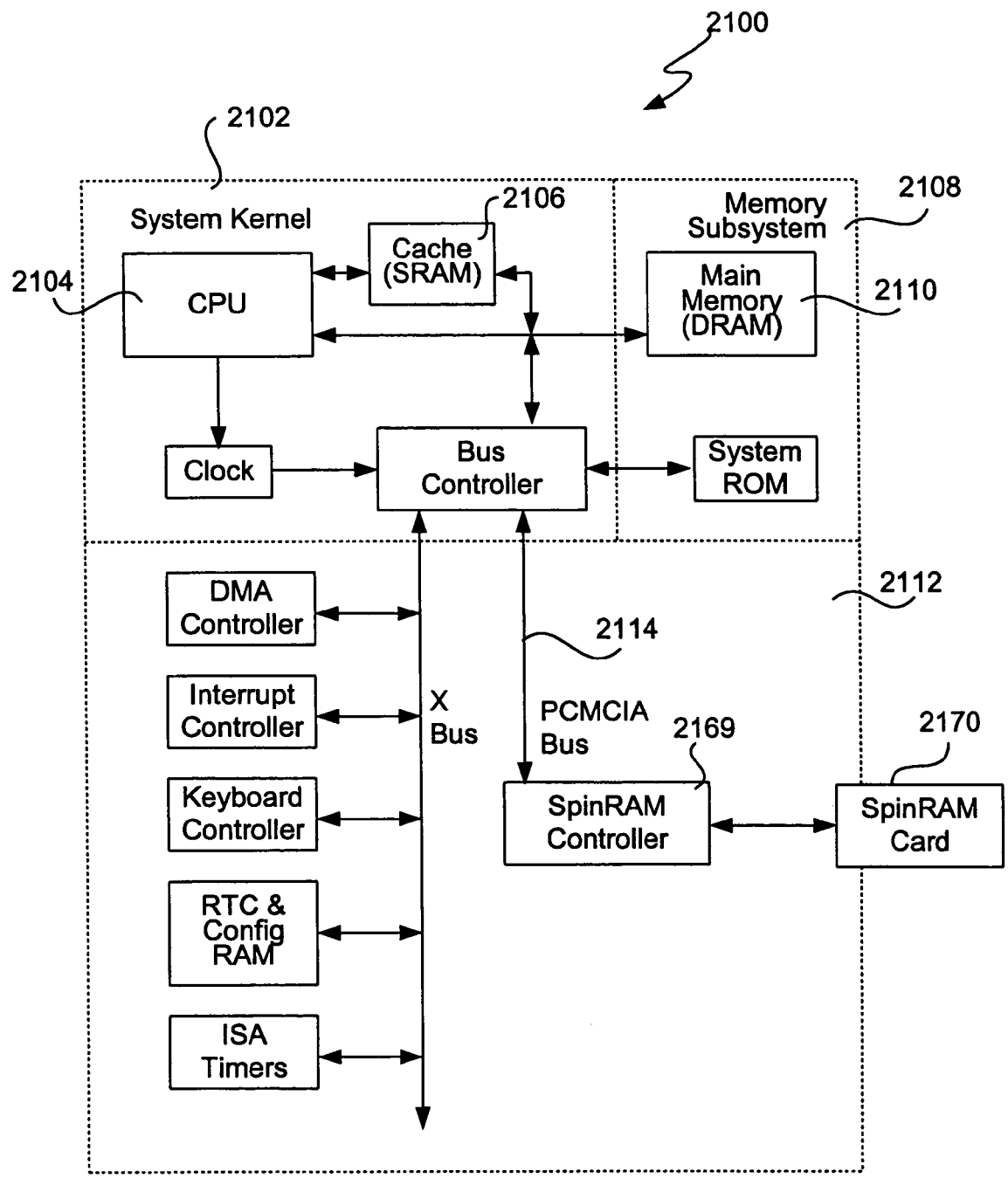
FIG. 21 is a functional block diagram of a personal computer system having a PCMCIA architecture in accordance with a specific embodiment of the invention.

FIG. 21 is a functional block diagram of a personal computer system 2100 having a PCMCIA architecture in which a conventional hard disk drive and its controller (typically coupled to PCMCIA bus 2114 have been replaced by SpinRAM controller 2169 and SpinRAM card 2170. System kernel 2102 includes CPU 2104 and cache memory 2106 which may be the CPU's primary cache or, where the CPU includes an integrated primary cache, the CPU's secondary cache. Memory subsystem 2108 includes the main system memory 2110. PCMCIA subsystem 2112 includes PCMCIA bus 2114 which is coupled to SpinRAM controller 2169.

It should be noted that the examples of specific memory architectures described above are tailored to replace an existing installed base of computer systems in which the ways in which the different types of memories are connected to the system are artifacts of the characteristics of the memory technologies themselves, and may not take full advantage of the performance capabilities of the SpinRAM technology described herein. That is, for example, although plugging a SpinRAM hard card as a replacement for a hard disk drive may represent a simple and fast integration of giant magnetoresistive memory technology into the vast installed base of IBM compatible PCs, a more fundamental memory architecture shift is contemplated which will more readily exploit the advantages of the memories of the present invention.

This may be understood with reference to the architectural constraints of the PC bus system. Because the time required for a CPU to retrieve data from a conventional hard disk is primarily a function of disk access time rather than propagation delay through the bus controller, there is little or no penalty associated with connecting the hard disk to the CPU through the controller. Of course, this is not the case for cache and system memory which are directly connected (architecturally) to the CPU. With the fast access times of the SpinRAM technology of the present invention, it is desirable to connect SpinRAM-based mass storage to the CPU in such a way to avoid the penalty imposed by conventional PC bus architectures. Such an embodiment is shown in FIG. 22.

Figure 22:
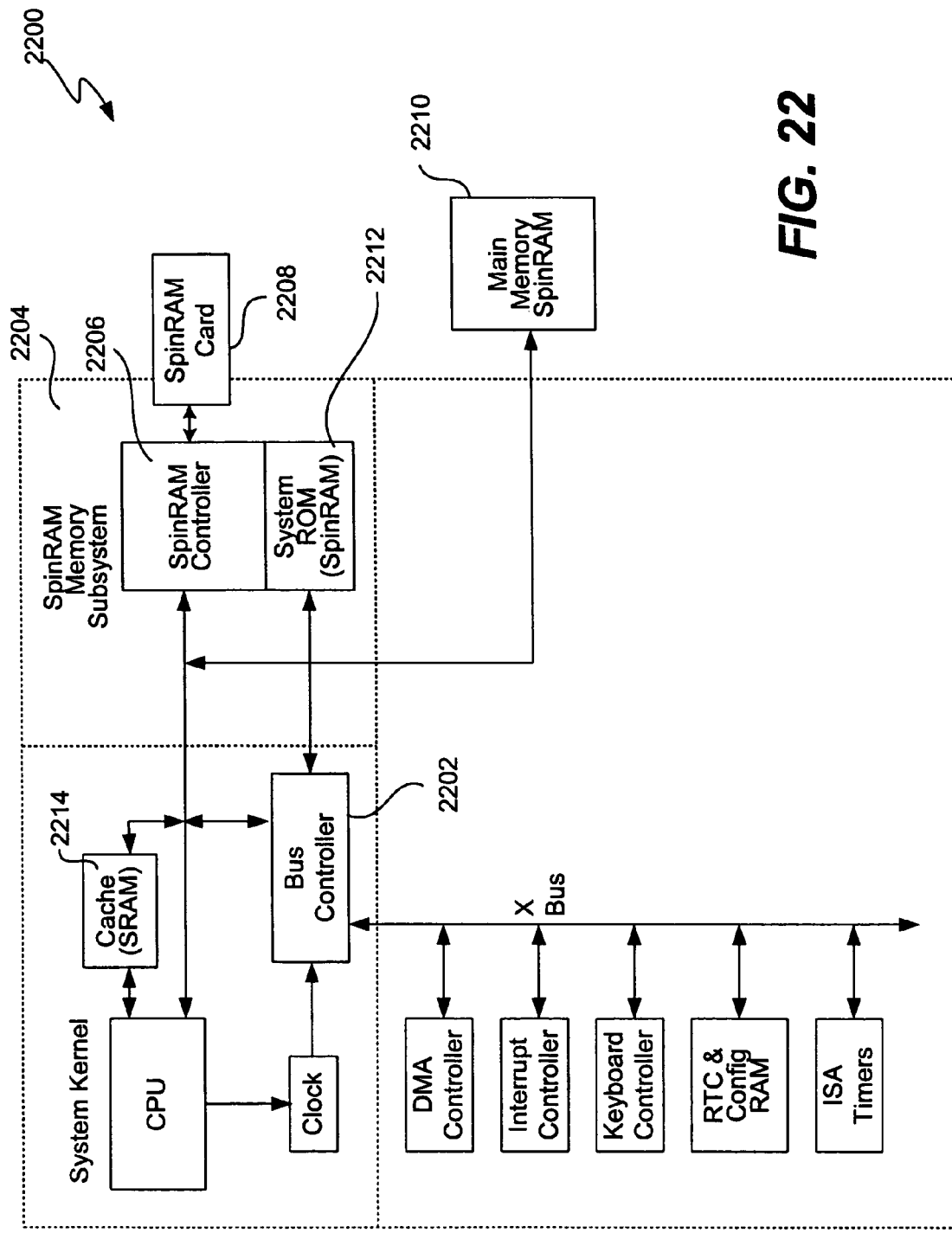
FIG. 22 is a block diagram of computer system using SpinRAM technology in accordance with a specific embodiment of the invention.

FIG. 22 is a block diagram of computer system 2200 using SpinRAM technology for system memory, system ROM, and mass storage. According to this embodiment, the architecture of computer system 2200 is designed with the capabilities of giant magnetoresistive memory technology in mind, e.g., access to mass storage via bus controller 2202 and a PC bus is eliminated. A SpinRAM memory subsystem 2204 comprises SpinRAM controller 2206 to which SpinRAM card 2208 connects. SpinRAM card 2208 may, for example, be implemented as discussed above with reference to SpinRAM card 1970. Main memory 2210 is also part of memory subsystem 2204 and comprises a SpinRAM array.

System ROM 2212 is also implemented as a giant magnetoresistive SpinRAM array. System ROM 2212 may be used, for example, to store a PC's BIOS code or user applications for a palm top device. Using the byte alterable SpinRAM of the present invention for system ROM allows the capability of updating what is typically hard coded information in many of today's computer systems. According to another embodiment, cache memory 2214 may also be implemented using the SpinRAM technology of the present invention.

It will be understood that SpinRAM memory subsystem 2204 may be configured in a variety of ways and remain within the scope of the invention. That is, subsystem 2204 may comprise different subsets of memories 2208, 2210, 2212 and 2214. In addition, different subsets of these memories may be integrated in the same device or configured as separate modules.

It will be understood that the various memory architectures described herein are merely exemplary and should not be construed as limiting the scope of the invention. For example, specific implementations have been described herein with reference to a selection matrix implemented using single input transpinnors (e.g., see FIG. 17). It will be understood, however, that a two input transpinnor such as transpinnor 1302 of FIG. 13 may also be used to implement such a selection matrix. That is, two-line selection striplines could supply magnetic fields to the two-input transpinnors in the matrix array with a separate power current input.

In addition, it will be understood that the number of memory access lines required to access information in the individual memory cells in a memory array may vary in accordance with the structure of the memory cells and the number of bits stored in each. The number and types of access lines for a given memory cell structure may be determined by one of skill in the art of memory technology from, for example, the descriptions of various GMR memory cells herein.

Furthermore, although an example of a unified memory architecture has been described herein in the context of specific architecture types, it will be understood that a wide variety of memory architectures for computers and other systems may be employed.

As discussed above, in one such architecture a rotating disk is physically but not logically replaced with a SpinRAM array. That is, a memory controller is configured such that the rest of the system operates as if it is connected to a rotating disk, but the controller interacts with the SpinRAM array. Such an architecture eliminates the disadvantages of rotating disk memories (e.g., long access times, susceptibility to environmental conditions) without the need for extensive retrofitting or redesign of installed computer base.

Another contemplated architecture involves the partial replacement of system memory with the SpinRAM technology of the present invention. The SpinRAM portion of the system memory could, for example, be used to store data that must be preserved in the event of a power failure. According to a specific implementation, the SpinRAM portion of the system memory store a small RAM file system which provides very fast access to a subset of the system's overall file stores.

Of course full replacement of system memory with Spin-RAM technology is contemplated as well. This would allow expansion of the use of system memory to include data which must be maintained through power loss and system reboots. Such a system could recover much faster than conventional systems after a power down has occurred. All that would need to be done is the normal processor power-up diagnostics and the restoration of the internal machine state. No time would be wasted reloading information from mass storage to system memory.

Another contemplated architecture replaces both system DRAM and magnetic disk storage with SpinRAM technology. The replacement of both of these memories makes possible the unified memory architecture in which most or all of a computer system's memory is implemented using a single technology, i.e., SpinRAM. Further variations of such an architecture include the replacement of other memories with SpinRAM technology including, for example, cache memory and system ROM.

Figure 23:
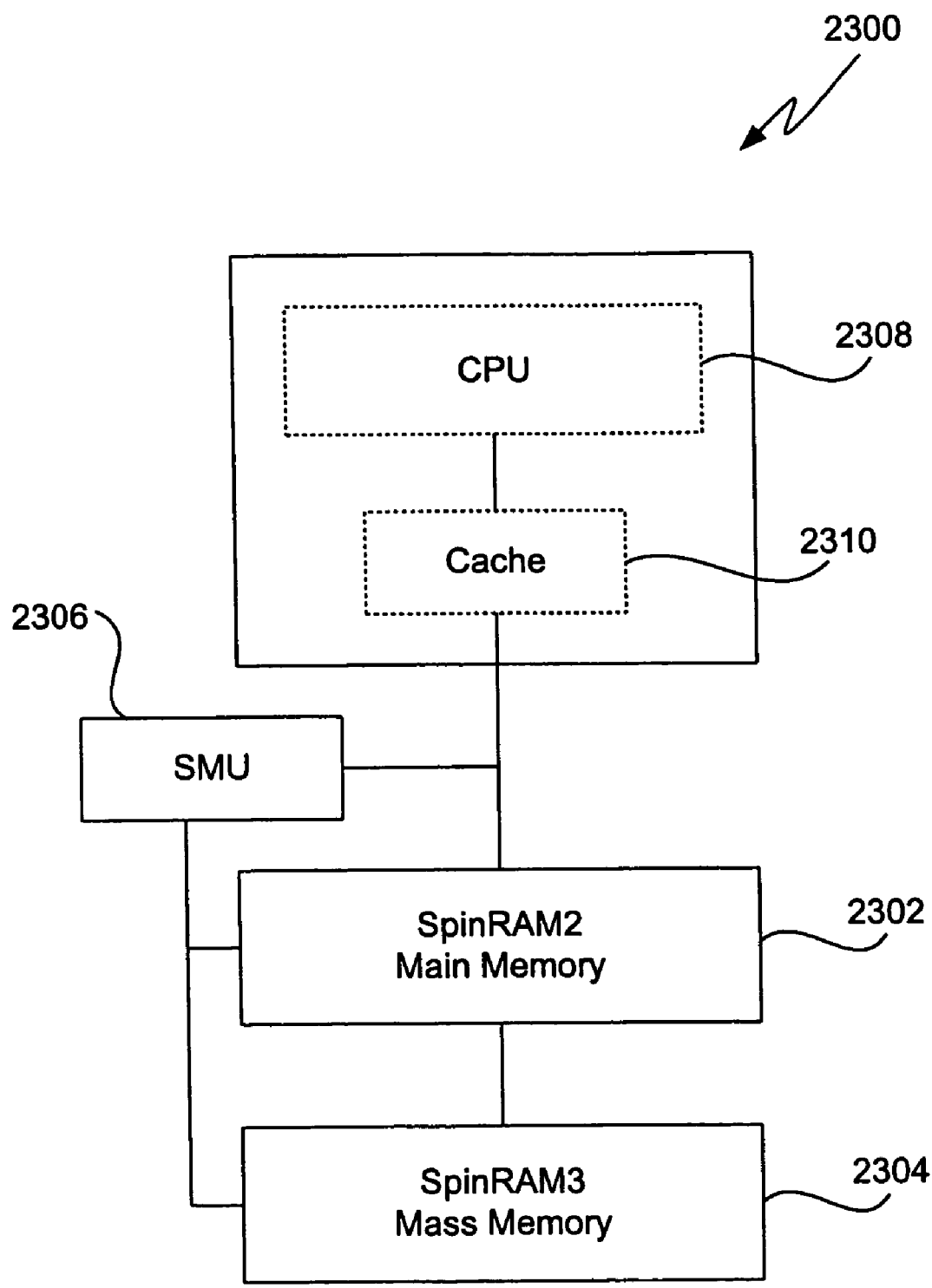
FIG. 23 is a simplified block diagram of a generalized computer system based on SpinRAM technology in accordance with a specific embodiment of the invention.

A simplified block diagram of a generalized computer system based on the SpinRAM technology is shown in FIG. 23. The design of system 2300 is based on a two-tier architecture incorporating at least SpinRAM2 (2302) and SpinRAM3 (2304), i.e., SpinRAM replacements for DRAM and rotating disk, respectively. The main memory pool is based on SpinRAM2 (RAM speed memory), and secondary file storage on SpinRAM3 (disk density). A SpinRAM Management Unit (SMU) 2306 handles transfers between memories 2302 and 2304 and CPU 2308, providing much the same functionality as a conventional cache management unit in a computer system employing the cache memory paradigm. A cache memory 2310 may be provided close to CPU 2308 and may comprise SpinRAM1 technology. An level one cache memory (not shown) may be provided integrated with CPU 2308.

It should be noted that SpinRAM technology allows the cache paradigm to be carried throughout system 2300 regardless of the number of SpinRAM levels. Thus, for example, CPU 2308 receives data from its level one cache. The level one cache receives data from the level two cache (e.g., cache 2310). The level two cache receives data from main memory 2302. Main memory 2302 acts as a level three cache in concert with SMU 2306. Finally, main memory 2302 receives data from mass storage memory 2304 which acts as a fourth level cache.

As mentioned above, building silicon-based three-dimensional structures is problematic. This is primarily due to the fact that crystalline-silicon ICs can only be reliably built as planar two-dimensional structures on the top surface of the wafer. Attempts to build electronic functions in amorphous silicon structures or partially crystalline structures have been largely unsuccessful, such circuits being difficult to manufacture and being characterized by a wide dispersion of functional parameters and significant performance degradation.

By contrast, a wide variety of three-dimensional integrated circuits are made possible by the present invention. According to various embodiments of the invention, such structures are fabricated by a purely additive process of stacking a circuit layer on top of another similar or dissimilar structure. Because of the nature of the all-metal circuit components in these circuit layers (e.g., transpinnors, Spin-RAM memory cells), this may be done without performance degradation or an increase in circuit area. And because of the ability to expand in a third dimension, embodiments of the present invention also allow scaling to higher densities without having to decrease feature size, thus avoiding the exponential increase in cost and technical hurdles associated with migrating to ever finer manufacturing geometries.

Figure 24:
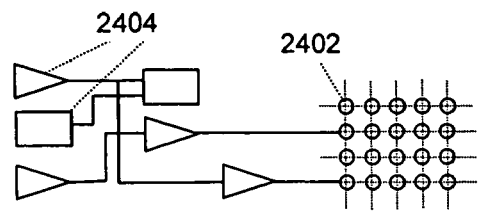
FIG. 24 is a simplified block diagram of an all-metal circuit which may be implemented according to various embodiments of the invention.

As discussed above, the transpinnor is an all-metal active device. Transpinnor-based circuits can be fabricated on almost any substrate including, for example, other all-metal circuits and components, glass, and any form of silicon. And specifically, they may employ, but do not require a semiconductor substrate. SpinRAM memory cells also may employ, but do not need a semiconductor substrate. Both the transpinnor and SpinRAM cell are constructed of several layers of magnetic and non-magnetic materials deposited on top of each other. As referred to herein, an integrated circuit structure includes a collection of transpinnors and SpinRAM cells wired to perform a predetermined function. A partial schematic diagram of an exemplary transpinnor and Spin-RAM integrated circuit is shown in FIG. 24. An array of SpinRAM cells 2402 is shown with support electronics comprising a variety of transpinnor-based circuits 2404.

Figure 25:
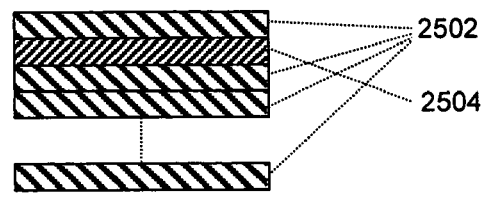
FIGS. 25–27 are simplified representations of cross-sections of three-dimensional structures designed according to various specific embodiments of the invention.
Figure 26:
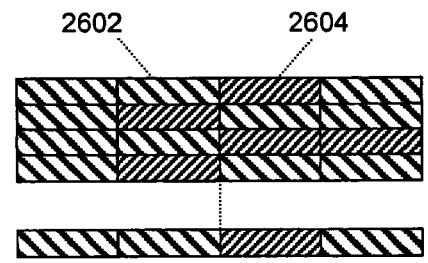

The fact that no special substrate is needed to build a transpinnor or a SpinRAM cell allows both individual transpinnors and SpinRAM cells, or transpinnor and Spin-RAM cells-based structures, to be stacked vertically and electrically connected, as needed, by linking the layers through wires. The vertical disposition of transpinnor or SpinRAM cells, as well as of transpinnor and SpinRAM-based structures modifies the physical deployment of the system building blocks without affecting the logical and electronic functionality of the system. FIG. 25 illustrates a cross section of a structure in which transpinnor circuits 2502 and SpinRAM cells 2504 are deployed vertically. FIG. 26 illustrates a cross section of a more complex structure in which transpinnor circuits 2602 and SpinRAM cells 2604 are deployed both vertically and horizontally.

Figure 27:

According to specific embodiments, the vertical manufacturing techniques provided by the present invention enable the fabrication of nonvolatile memory structures with all-metal support electronics. Such support electronics may include, but not limited to, sense amplifiers, decode circuitry, bit drivers, word drivers and data buffers. As shown in FIGS. 25 and 26 and as will be discussed below, these support electronics may be deployed above, below, or alongside the memory cell array(s). In a memory block structure in which the memory cell array and the support electronics are deployed on separate layers (as shown in FIG. 27), the area occupied by the memory block may be reduced to the larger of the two layers (e.g., memory cell array 2702 or support electronics layer 2704). This could significantly reduce the overall physical area of the memory component while potentially increasing the area density by orders of magnitude.

Figure 28:
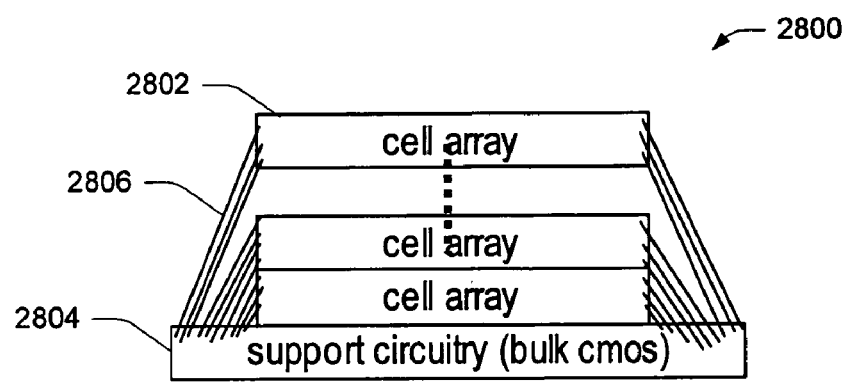
FIG. 28 is a simplified representation of a stacked three-dimensional structure designed according to a specific embodiment in which a semiconductor substrate is employed.
Figure 29:
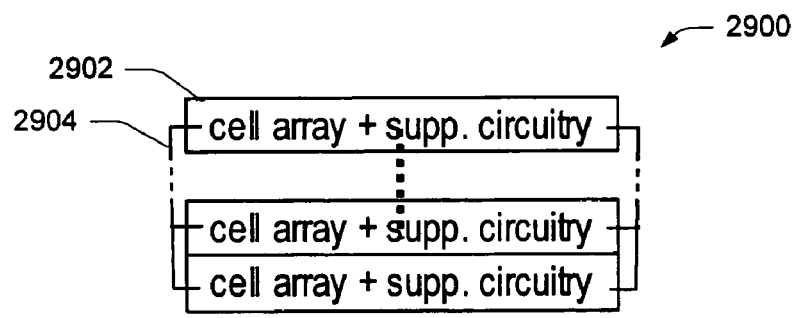
FIGS. 29 and 29A are simplified representations of all-metal stacked three-dimensional structures designed according to specific embodiments.

FIGS. 28 and 29 show two different approaches to constructing a block of memory according to the invention. In FIG. 28, a hybrid memory block 2800 includes memory cell arrays 2802 stacked on top of a bulk CMOS semiconductor substrate 2804 in which the support circuitry for arrays 2802 is implemented. Vertical connectivity between substrate 2804 and the individual arrays 2802 is provided by signal lines 2806. This solution entails increasing loss of performance of the memory cells with increasing distance from the silicon substrate. This limits the number of stacked layers. In FIG. 29, an all-metal memory block 2900 includes all-metal levels 2902 interconnected by interconnect 2904. And although the depicted structure indicates that each level includes both memory cells and support circuitry, it will be understood that these may be deployed on alternate levels as described above with reference to FIGS. 25 and 26.

The all-metal structure of FIG. 29 may enjoy several advantages over the hybrid structure of FIG. 28. For example, because support electronics in memory block 2900 may be included on the same or an adjacent level with the corresponding memory array, the likelihood of signal degradation or skew is reduced as compared to memory block 2800 in which the distance between each successive cell array and the support circuitry in substrate 2804 increases. In addition, the semiconductor portion of memory block 2800 makes it more susceptible to intense radiation environments as compared to the uniformly radiation hard structure of memory block 2900. Moreover, because of the increasing length of the upper-level wires, signal delays and degradation will limit the number of layers that can be stacked. Finally, memory block 2800 requires the high temperature fabrication processes by which semiconductor processing is characterized as compared to the relatively low temperature deposition processes by which the all-metal levels of memory block 2900 may be fabricated.

Figure 30:
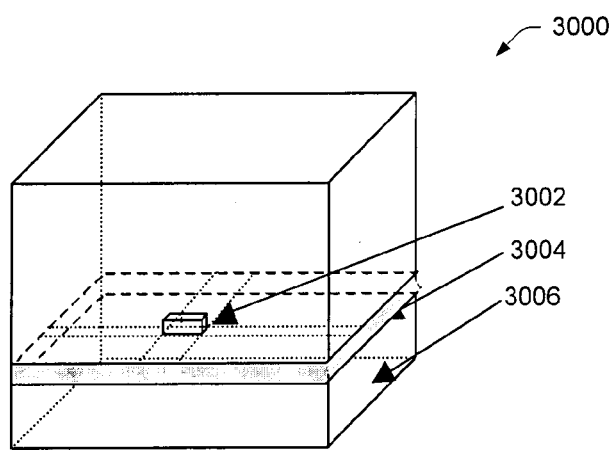
FIG. 30 is a representation of a stacked three-dimensional structure designed according to an embodiment of the invention in which the structure comprises a plurality of stacked modules or tiles.

According to specific embodiments of the invention, a modular approach to the construction of 3D circuits is provided. According to one such embodiment illustrated in FIG. 30, all-metal components in a 3D structure 3000 are fabricated in modular, self-contained "tiles" 3002 of a variety of types. For example, some tiles are arrays (which may be of arbitrary size) of all-metal memory cells which may comprise, for example, the SpinRAM described herein. Such memory cell tiles may or may not include support electronics. Other tiles may be all-metal (e.g., transpinnor-based) electronics which may provide support electronics for corresponding memory arrays or perform some other function.

Figure 29A:
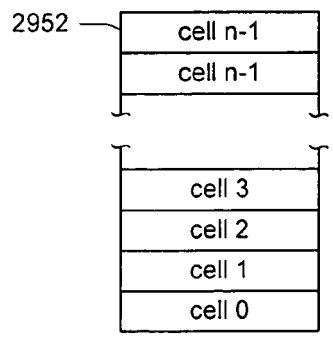

The magnetic-film structure in FIG. 29A shows another specific embodiment of the invention. According to such an embodiment, memory cells 2952 in a specific block of memory are built vertically, i.e., on top of each other, rather than horizontally, i.e., next to each other. As shown, n cells may be stacked in consecutive layers, and may represent n bits of memory (where there is one bit per cell). Such a configuration may be useful, for example, where the block of memory is associated with underlying circuits or structures. The number of cells to be stacked in this manner is limited only by processing technology considerations.

Tiles 3002 may be contiguously arranged in a two-dimensional "floor" or "level" 3004 which may be fabricated according to the invention on top of another such level or directly on top of a substrate 3006. As discussed above, substrate 3006 may comprise a wide variety of rigid, flexible, and even organic materials including, for example, glass, polyimide, polycarbons, and silicon.

Figure 31:
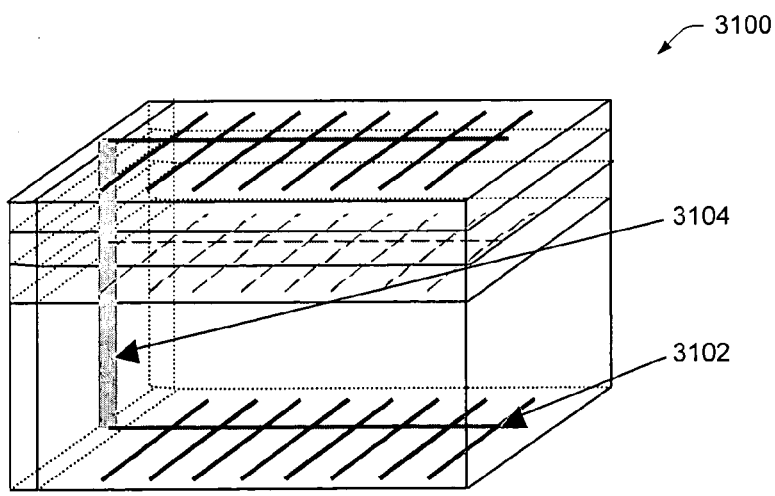
FIG. 31 illustrates an exemplary interconnect for use with various embodiments of the invention.

Whether or not this modular approach is employed, connectivity within and between floors of components, tiles, or modules in a 3D structure designed according to the invention may be provided as shown in FIG. 31. In the embodiment shown, each floor has its own dedicated horizontal connection stratum 3102 which provides connections to each circuit, cell, or tile on the floor. Regardless of the particular implementation, connection strata 3102 may be, for example, a network of conventional striplines which are patterned and deposited according to any of a variety of well known techniques.

Connectivity between floors may be provided by a vertical connection structure 3104 which connects with horizontal connection strata 3102. According to various embodiments, connection structure 3104 may comprise one or more structures at one or more edges of 3D structure 3100. According to other embodiments, connection structure 3104 may comprise one or more structures deployed between the tiles of the various floors of structure 3100. In the embodiment shown, vertical connection structure 3104 is provided along one edge of 3D structure 3100 resulting in only a slight increase (e.g., 2–5%) in the structure's footprint. Connectivity between floors can be achieved with more than just one vertical connection structure 3104. Implementation with multiple vertical connections can result in shorter total connectivity. The vertical connection structures can be implemented by utilizing well known and mature metallization techniques.

Figure 32:
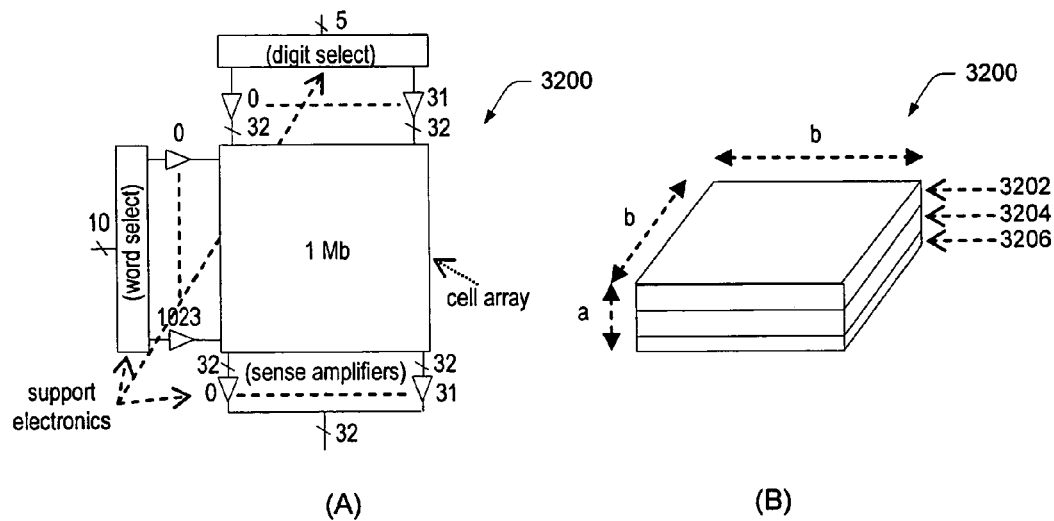
FIGS. 32 and 33 illustrate alternative tile configuration for use with various embodiments of the invention.
Figure 33:
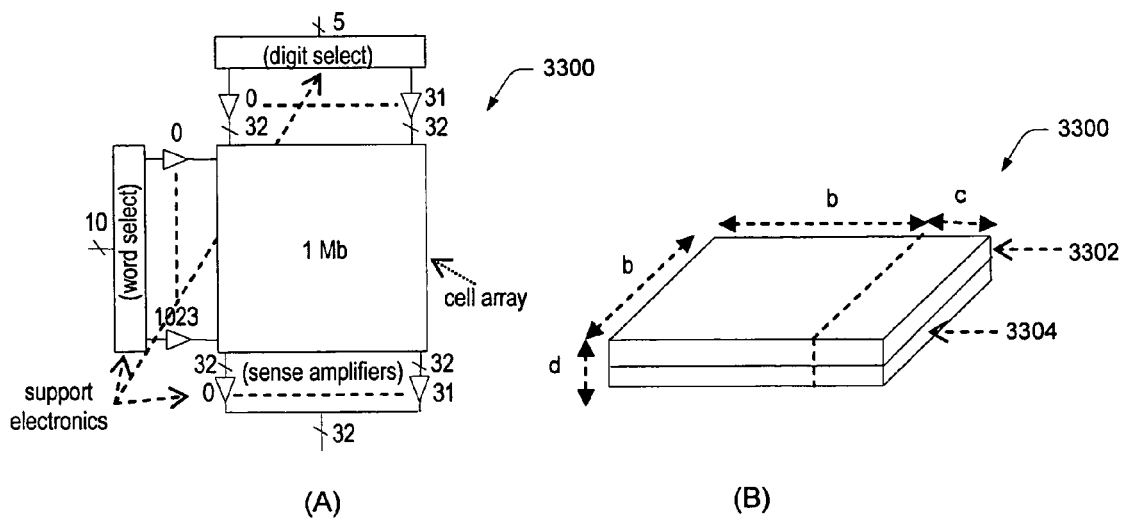

Two alternative memory module tile configurations which may be employed with various embodiments of the invention will now be described with reference to FIGS. 32 and 33. In each of these embodiments, a tile is a fully functional memory module with a memory array, selection circuitry, and sense amplifiers. FIGS. 32A and 32B depict schematically and physically, respectively, what is referred to herein as a "folded" tile. In this context, the term "folded" is used to refer to a memory module 3200 in which memory cell arrays 3202 and support electronics 3204 are deployed on separate levels. Support electronics may include, for example, address logic and sense amplifiers. A connection stratum 3206 (preferably deployed on a separate level) provides for intra-tile connections. As with the connection structure of FIG. 31, connection stratum 3206 may comprise, for example, a network of conventional striplines which are patterned and deposited according to any of a variety of well known techniques. As shown, the area of the tile is $b^2$ with a height of a. Exemplary values for b and a are 250 $\mu$m and 0.2 $\mu$m, respectively.

FIGS. 33A and 33B similarly depict an "unfolded" tile corresponding to a memory module 3300 in which memory cells and support electronics are deployed on the same level 3302. Intra-tile connectivity is provided by connection stratum 3304. The area of the tile is now increased (i.e., by b×c), while the height decreases (i.e., d<a). Exemplary values for c and d are 120 $\mu$m and 0.12 $\mu$m, respectively.

It should be noted that the two different embodiments are schematically identical as shown in FIGS. 32A and 33A. However, from a physical point of view, the folded tile (memory module 3200) provides a memory cell array area efficiency of 100%, i.e., the overhead represented by the support electronics and the tile connections do not increase the footprint of the module. On the other hand, the unfolded tile (memory module 3300) has fewer layers, requiring fewer mask and processing steps to fabricate. It should be noted that the 1 Mb size of memory modules 3200 and 3300 is merely exemplary.

Regardless of whether folded or unfolded tiles or some other type of all-metal module is employed to construct the 3D structures of the present invention, a variety of approaches may be employed to control and/or reduce the defect rates in such structures. As with most processes, the rate of such defects is expected to decrease as the process matures. In addition, block defect isolation logic may be built into tiles or modules using all-metal electronics such as, for example, transpinnor-based electronics. Finer segmentation of the basic tile or module could both reduce the probability of defects in individual modules as well as facilitate the location and isolation of defects without decreasing storage density or reducing access performance.

The low cost of building redundancy into such structures may also be leveraged to mitigate the effect of defects.

A 1 Gb memory block designed according to a specific embodiment of the present invention will now be described with reference to FIGS. 34A–34D. FIG. 34A shows a top plan view of an all-metal 3D structure 3400 which includes 1023 1 Mb memory modules 3402 and vertical connection structure 3404. In the embodiment shown, folded tiles are employed for memory modules 3402, e.g., module 3200 of FIG. 32. FIG. 34B shows a perspective view which shows a floor 3406 of memory cells and a separate floor 3408 of support electronics for the memory cells. Connection stratum 3410 provides intra-tile connectivity as well as connections to vertical connection structure 3404. The footprint of the structure is given by p (p+q), and the height is a. Exemplary values for p, q, and a are 2 mm, 0.1 $\mu$m and 0.2 $\mu$m, respectively.

Figure 34:
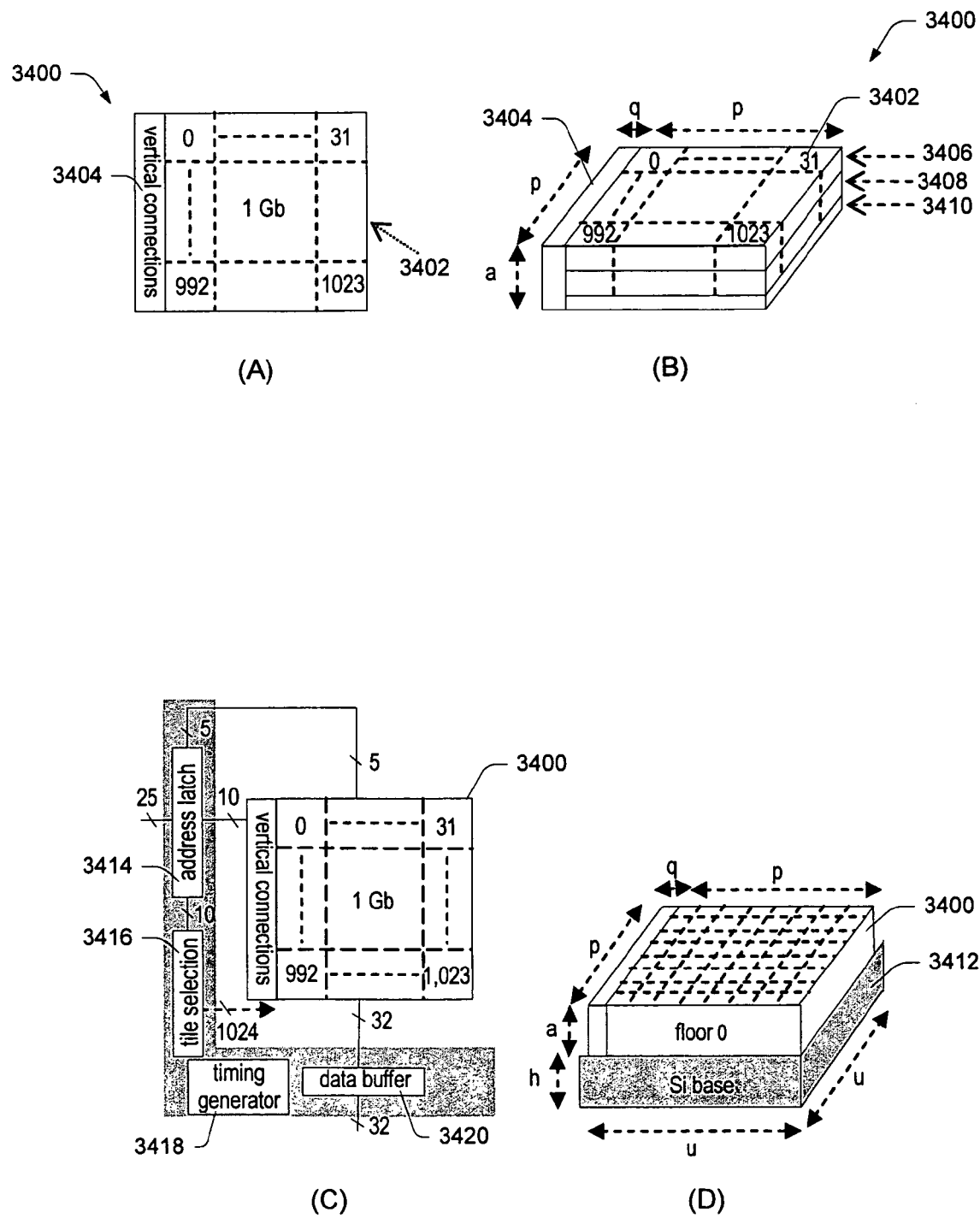

FIGS. 34C and 34D are, respectively, schematic and physical representations of 3D structure 3400 on a silicon base 3412 which includes circuitry for controlling access to the memory cells in 3D structure 3400 including, for example, address latch circuitry 3414, tile selection circuitry 3416, timing generator 3418, and data buffer 3420. The footprint of the base is $u^2$, and the height is h. Exemplary values for u and h are 2.5 mm and 100 $\mu$m, respectively. It should be noted that the semiconductor/magnetic-film hybrid structure of FIG. 34 is exemplary. An equivalent all-metal structure may be constructed without departing from the scope of the invention.

Figure 36:
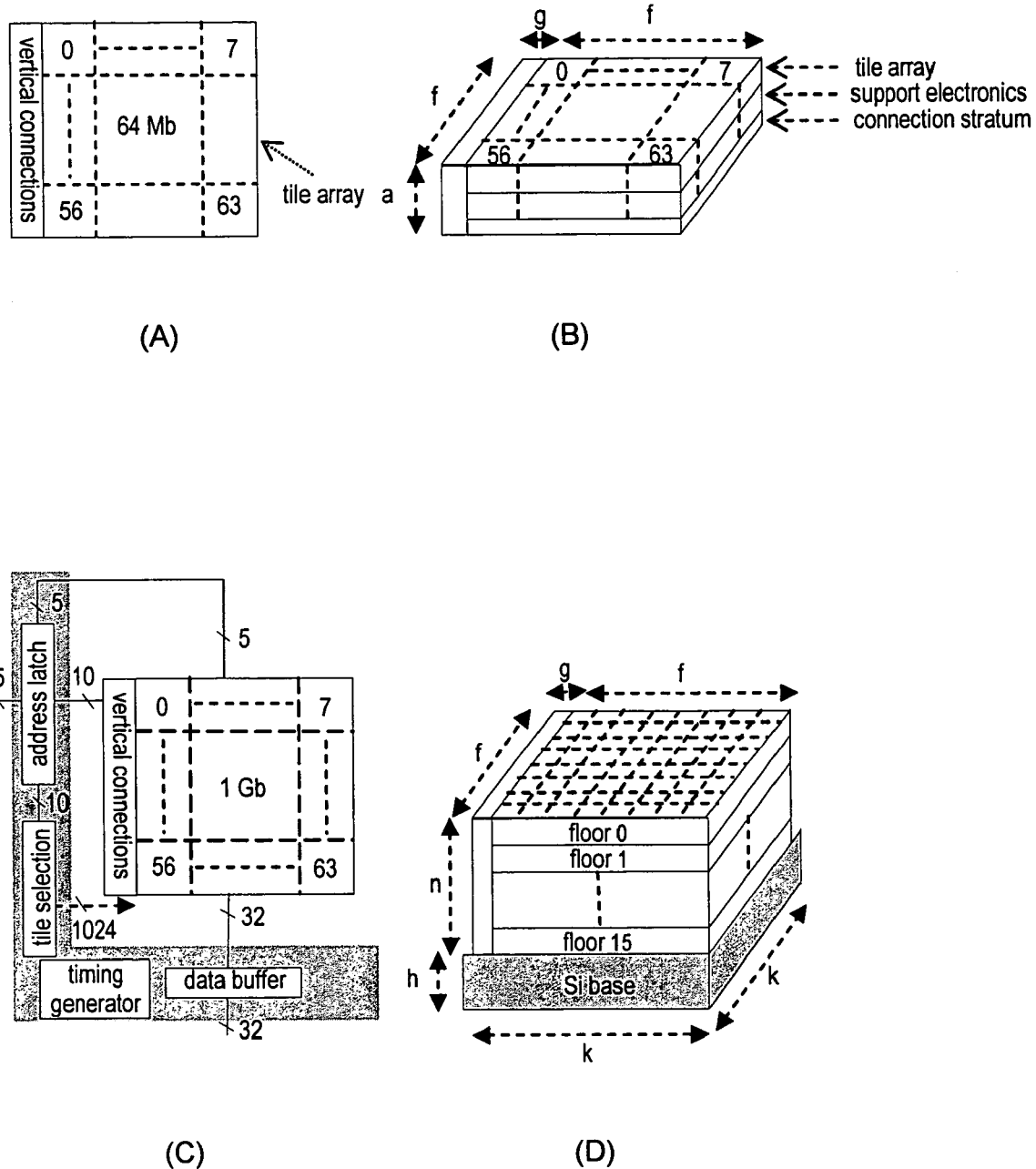
Figure 37:
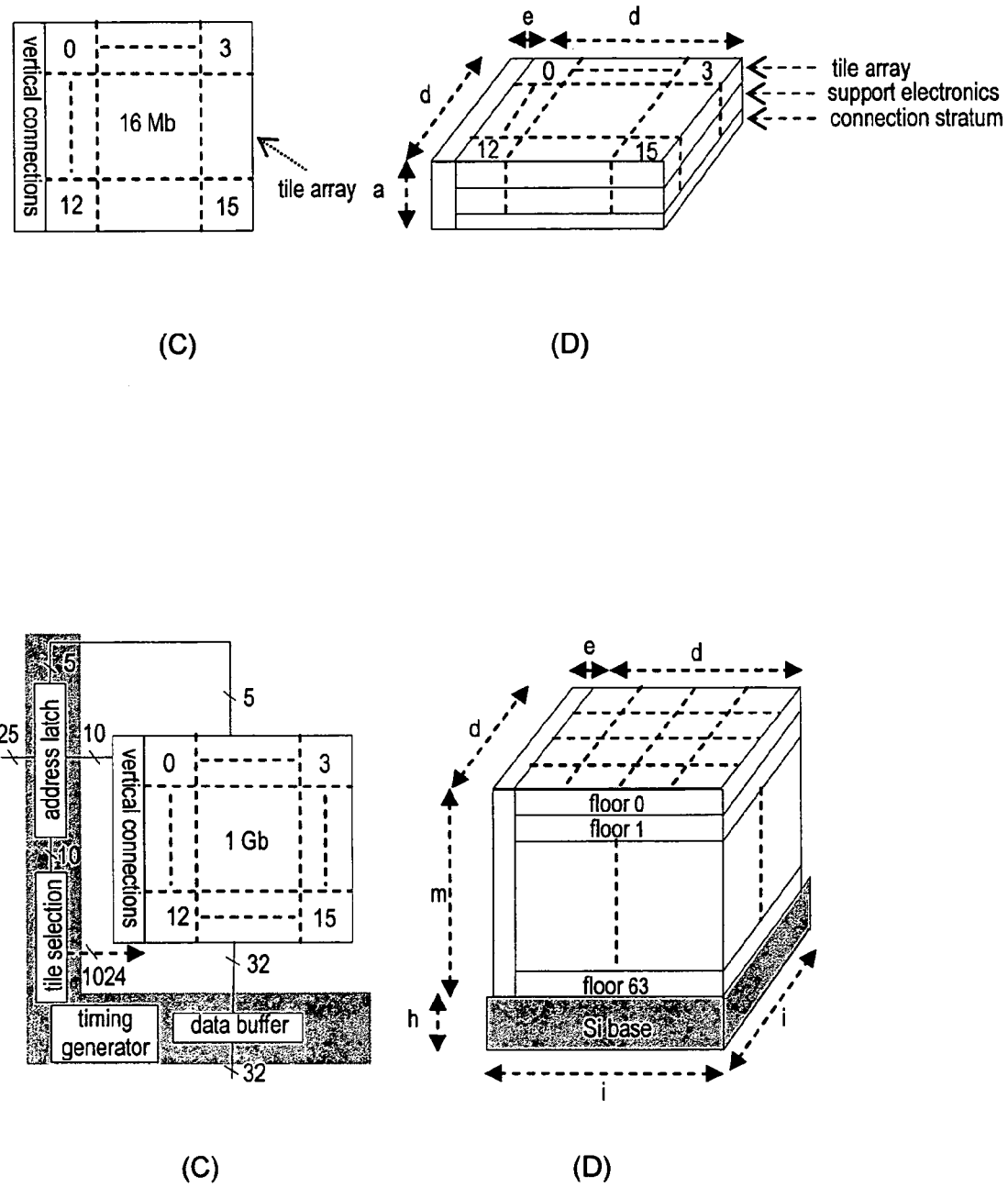

Each of FIGS. 35, 36, and 37 shows a 3D structure for a 1 Gb memory block designed according to a specific embodiment of the invention. FIGS. 35A–35D show views of a multi-floor embodiment on a semiconductor substrate. In this embodiment, each floor 3502 of memory block 3500 comprises 256 1 Mb memory tiles (e.g., memory module 3200 of FIG. 32) arranged in memory cell level 3504, a support electronics level 3506, and a connection stratum 3508. Vertical connection structure 3510 provides inter-floor connectivity and connections to access control circuitry of semiconductor substrate 3512. The footprint of the memory block is given by r (r+s), and the height is t. Exemplary values for r, s, and t are 1 mm, 0.1 $\mu$m and 0.8 $\mu$m, respectively. The footprint of the base is $v^2$, and the height is h. Exemplary values for v and h are 1.2 mm and 100 $\mu$m, respectively.

FIGS. 36A–36D show views of a multi-floor embodiment having 16 floors, each having 64 1 Mb memory tiles. The footprint of the memory block is given by f (f+g), and the height is n. Exemplary values for f, g, and n are 2 mm, 0.1 $\mu$m and 3.2 $\mu$m, respectively. The footprint of the base is $k^2$, and the height is h. Exemplary values for k and h are 2.5 mm and 100 $\mu$m, respectively.

FIGS. 37A–37D show views of a multi-floor embodiment having 64 floors, each having 16 1 Mb memory tiles. The footprint of the memory block is given by d (d+e), and the height is m. Exemplary values for d, e, and m are 1 mm, 0.1 $\mu$m and 12 $\mu$m, respectively. The footprint of the base is $i^2$, and the height is h. Exemplary values for i and h are 1.2 mm and 100 $\mu$m, respectively. As will be understood, the numbers of floors, tiles per floor, types of tiles (e.g., folded vs. unfolded), dimensions of floors and tiles, etc., in FIGS. 34–37 are merely exemplary and should not be considered to limit the scope of the invention.

It should be noted that the semiconductor-magnetic-film hybrid structures of FIGS. 35, 36, and 37 are merely exemplary. Equivalent magnetic-film structures can be constructed without departing from the scope of the invention.

Figure 38:
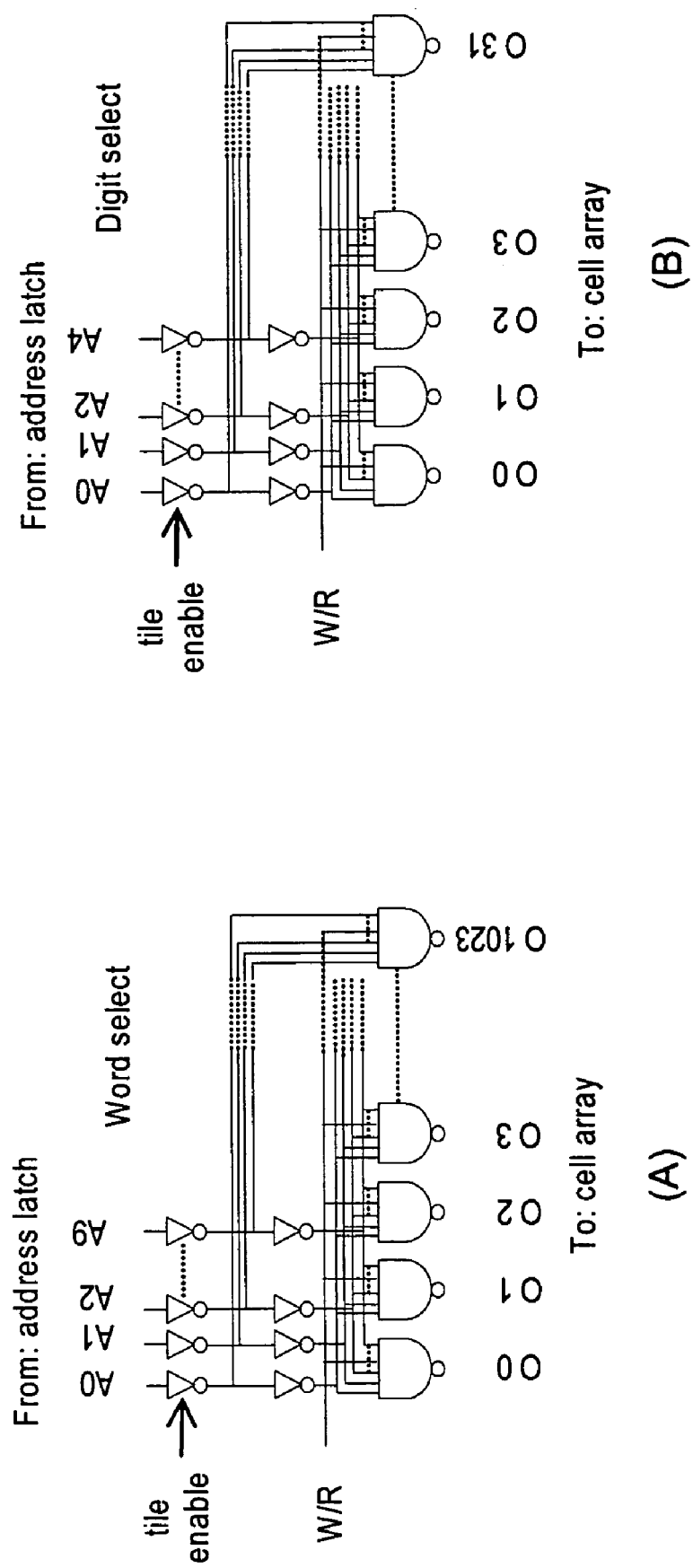
FIGS. 38 and 39 are schematics of exemplary support electronics for use with various embodiments of the invention.
Figure 39:
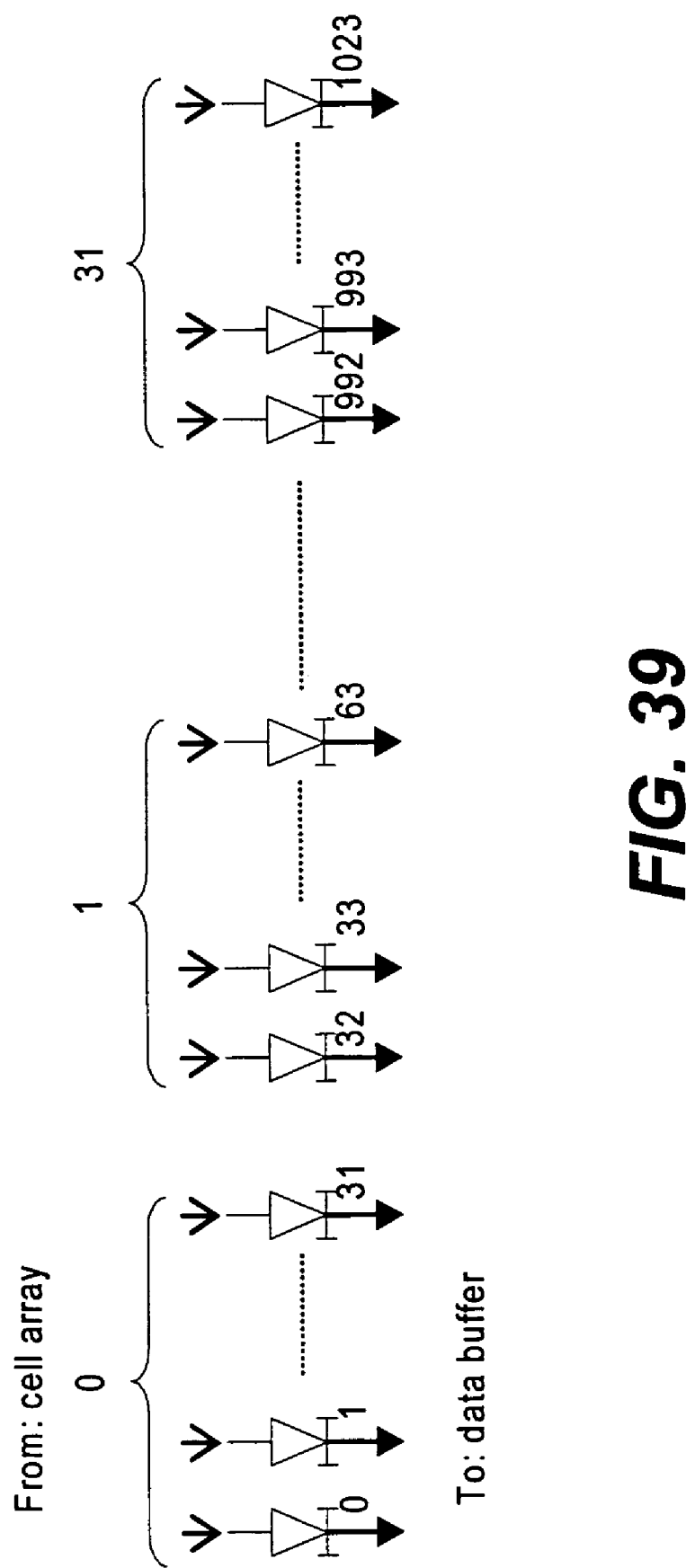

FIGS. 38A, 38B, and 39 illustrate some exemplary support electronics which may be employed to facilitate access to memory arrays designed according to various embodiments of the invention. For example, any of the embodiments of FIGS. 32–37 may employ such support electronics. FIGS. 38A and 38B illustrate word select and digit select driver circuits, respectively, for selection of memory locations for read and write operations. FIG. 39 illustrates sense amplifiers for receiving data from all-metal memory cells and delivering them to the data buffer. According to a specific embodiment, the circuits of FIGS. 38 and 39 are implemented using all-metal transpinnor-based electronics as described herein. According to other embodiment, some other form of all-metal technology may be used.

Various of the structures enabled by the present invention have significant advantages relating to power consumption. For example, in a modular structure constructed from stacked memory modules or tiles which, in turn, comprise all-metal GMR-based memory cell arrays and transpinnor-based support electronics, the memory cells and electronic components are inherently passive devices, i.e., no powered substrate is required. Therefore, power may be applied selectively, i.e., only to the addressed group of cells and ancillary circuitry. That is, for a typically memory access, power is only applied to a single tile at a time, and only to a small subset of that tile's circuitry. As a result, power consumption remains constant, even as the 3D structure scales to higher capacities. In addition, the non-volatile nature of such memory cells eliminates the high power consumption associated with standby and refresh. Moreover, because such structures can be constructed without the use of semiconductors, the leakage currents associated with semiconductors can be eliminated.

While the invention has been particularly shown and described with reference to specific embodiments thereof, it will be understood by those skilled in the art that changes in the form and details of the disclosed embodiments may be made without departing from the spirit or scope of the invention. For example, several embodiments have been described which comprise blocks of memory which employ SpinRAM cells and transpinnor-based support electronics. However, it should be understood that other electronic circuits and subsystems may be constructed using the techniques and structures described herein without departing from the scope of the invention. In addition, the scope of the present invention should not be construed as being limited to the use of SpinRAM or transpinnor-based circuits as described herein. Rather, any suitable all-metal components may be used to construct the three-dimensional structures enabled by the invention.

In addition, as described in U.S. Pat. Nos. 5,929,636 and 6,031,273 (incorporated herein by reference above), transpinnors may be configured to perform the analog and digital functions required to implement any of a wide variety of electronic circuits and systems. Transpinnors are well suited to provide the basis of a variety of analog, digital and mixed general-purpose all-metal circuits, subsystems and systems. Moreover, they may be configured to provide the functionality of inductors and transformers. Since capacitance and resistance can be implemented with the same metal technology, all these components can be combined very effectively on the same substrate to produce a comprehensive variety of all-metal circuits. Therefore, for example, various embodiments of the invention may incorporate all-metal circuitry and electronics which perform logic, processing, or arithmetic functions (e.g., all-metal CPUs or controllers). All-metal circuits may also include linear and analog circuits. Finally, many of these different types of all-metal circuits and components may be combined to implement an all-metal system-on-a-chip (SOC).

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A three-dimensional circuit comprising a plurality of stacked levels on a substrate, each level comprising a plurality of all-metal circuit components arranged in two dimensions, the plurality of circuit components on at least one of the levels comprising a plurality of memory cells, each memory cell comprising a multi-layer structure exhibiting magnetoresistance, each multi-layer structure comprising a plurality of magnetic layers at least one of which is operable to magnetically store a bit of information, a plurality of access lines integrated with the plurality of magnetic layers and configured such that the bits of information may be accessed using selected ones of the plurality of access lines and a magnetoresistive effect, and at least one keeper layer, wherein the magnetic layers, the access lines, and the at least one keeper layer associated with each multi-layer structure form a substantially closed flux structure, the circuit further comprising an interconnect for providing interconnections between the circuit components on different ones of the plurality of levels.

2. The circuit of claim 1 further comprising a semiconductor level among the plurality of stacked levels.

3. The circuit of claim 2 wherein the substrate comprises the semiconductor level.

4. The circuit of claim 2 wherein the semiconductor level comprises support electronics for controlling access to the plurality of memory cells.

5. The circuit of claim 1 wherein the plurality of memory cells are arranged in a plurality of substantially identical and interchangeable memory array modules.

6. The circuit of claim 5 wherein each memory array module further comprises all-metal support electronics for controlling access to the corresponding memory array module.

7. The circuit of claim 5 wherein the memory array modules are arranged in the two dimensions and stacked to form at least a portion of the stacked levels of all-metal circuit components.

8. The circuit of claim 5 further comprising all-metal support electronics for controlling access to the plurality of memory cells.

9. The circuit of claim 8 wherein the all-metal support electronics are arranged in a plurality of circuit modules which are arranged in the two dimensions and stacked wit the memory array modules to form at least a portion of the stacked levels of all-metal circuit components.

10. The circuit of claim 1 wherein the plurality of circuit components on at least one of the levels comprise all-metal support electronics for controlling access to the plurality of memory cells.

11. The circuit of claim 10 wherein the plurality of the memory cells and the all-metal support electronics are arranged on separate ones of the stacked levels.

12. The circuit of claim 10 wherein the plurality of the memory cells and the all-metal support electronics are combined on selected ones of the stacked levels.

13. The circuit of claim 1 wherein the plurality of circuit components on at least one of the levels comprises a plurality of active circuit components, each active circuit component operable to generate an output signal based on a magnetoresistive effect.

14. The circuit of claim 13 wherein at least one of the active circuit components comprises a transpinnor comprising a network of multi-layer thin-film elements, at least one thin-film element in the transpinnor exhibiting giant magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is proportional to a power current in the network of thin-film elements.

15. The circuit of claim 13 wherein the active circuit components are interconnected to form a plurality of circuit modules.

16. The circuit of claim 15 wherein the circuit modules are arranged in the two dimensions and stacked to form at least a portion of the stacked levels of all-metal circuit components.

17. The circuit of claim 1 wherein the interconnect comprises a plurality of intra-level interconnect structures, each corresponding to one of the stacked levels and providing frat connections among the circuit components on the corresponding level, the interconnect further comprising at least one inter-level interconnect structure for providing second connections among the intra-level interconnect structures.

18. The circuit of claim 17 wherein the interconnect comprises a plurality of inter-level interconnect structures each of which provides a portion of the second connections between selected ones of the intra-level interconnect structures.

19. The circuit of claim 1 wherein the substrate comprises at least one of glass, a semiconductor, a metal, and a dielectric.

20. A three-dimensional circuit comprising a plurality of stacked levels on a substrate, each level comprising a plurality of all-metal circuit components exhibiting magnetoresistance and arranged in two dimensions, the circuit components forming logic and processing circuitry, the circuit further comprising an interconnect for providing interconnections between the circuit components on different ones of the plurality of levels.

21. A three-dimensional circuit comprising a plurality of stacked levels on a substrate, each level comprising a plurality of all-metal circuit components exhibiting magnetoresistance and arranged in two dimensions, the circuit components forming linear analog circuitry, the circuit further comprising an interconnect for providing interconnections between the circuit components on different ones of the plurality of levels.

22. A system-on-a-chip, comprising a three-dimensional circuit comprising a plurality of stacked levels on a substrate, each level comprising a plurality of all-metal circuit components exhibiting magnetoresistance and arranged in two dimensions, the circuit components comprising a plurality of all-metal memory cells, each memory cell comprising a multi-layer structure exhibiting magnetoresistance, the circuit components further comprising support electronics for controlling access to the memory cells, logic and processing circuitry, and linear analog circuitry, the circuit further comprising an interconnect for providing interconnections between the circuit components on different ones of the plurality of levels.

23. A memory system, comprising a plurality of stacked levels on a substrate, each of first selected ones of the stacked levels comprising a plurality of all-metal memory cells arranged in two dimensions, each memory cell comprising a multi-layer structure exhibiting magnetoresistance, each multi-layer structure comprising a plurality of magnetic layers at least one of which is operable to magnetically storing one bit of information, and a plurality of the access lines integrated with the plurality of magnetic layers and configured such that the bit of information maybe accessed using selected ones of the plurality of access lines and a magnetoresistive effect, wherein the magnetic layers and the access lines are part of a substantially closed flux structure, and wherein second selected ones of the stacked levels comprise support electronics for facilitating access to the memory cells, the support electrodes comprising a plurality of active circuit components, each active circuit component comprising a network of multi-layer thin-film elements at least one of which is operable to exhibit magnetoresistance, and a conductor magnetically coupled to the at least one thin-film element for controlling operation of the transpinnor, wherein each active circuit component is operable to generate an output signal which is a function of a resistive imbalance among the tin-film elements and which is proportional to a power current in the network of thin-film elements.

24. The memory system of claim 23 wherein selected ones of the plurality of memory cells form blocks of memory, the selected memory cells corresponding to each block of memory forming vertical stacks in consecutive ones of the stacked layers.

25. A three-dimensional circuit comprising a plurality of stacked levels on a substrate, each level comprising a plurality of all-metal circuit components arranged in two dimensions, the plurality of circuit components on at least one of the levels comprising a plurality of memory cells, each memory cell comprising a multi-layer structure exhibiting magnetoresistance, the plurality of memory cells being arranged in a plurality of substantially identical and interchangeable memory array modules, the memory array modules being arranged in the two dimensions and stacked to form at least a portion of the stacked levels, the circuit further comprising an interconnect for providing interconnections between the circuit components on different ones of the plurality of levels.

26. The circuit of claim 25 wherein the plurality of circuit components comprises all-metal support electronics for controlling access to the plurality of memory cells.

27. The circuit of claim 26 wherein the all-metal support electronics are arranged in a plurality of circuit modules which are arranged in the two dimensions and stacked with the memory array modifies to form at least a portion of the stacked levels of all-metal circuit components.

28. The circuit of claim 27 wherein the memory ray modules and circuit modules are arranged on separate ones of the stacked levels.

29. The circuit of claim 27 wherein the memory array modules and circuit modules are combined on selected ones of the stacked levels.

30. The circuit of claim 25 wherein the substrate comprises at least one of glass, a semiconductor, a metal, and a dielectric.

31. The circuit of claim 25 wherein each of the memory array modules comprises an array of nonvolatile memory cells and is operable to function independently.

32. The circuit of claim 31 wherein access to the memory cells in a particular memory array module requires power to be applied only to the particular memory array module.

33. A three-dimensional circuit comprising a plurality of stacked levels on a substrate, each level comprising a plurality of all-metal circuit components arranged in two dimensions, the plurality of circuit components on at least one of the levels comprising a plurality of active circuit components, each active circuit component being operable to generate an output signal based on a magnetoresistive effect the circuit further comprising an interconnect for providing interconnections between the circuit components on different ones of the plurality of levels.

34. The circuit of claim 33 wherein at least one of the active circuit components comprises a transpinnor comprising a network of multi-layer thin-film elements, at least one thin-film element in the transpinnor exhibiting magnetoresistance, the transpinnor further comprising a conductor magnetically coupled to the at least one thin-film element for controlling operation of the transpinnor, wherein the transpinnor is operable to generate an output signal which is a function of a resistive imbalance among the thin-film elements and which is proportional to a power current in the network of thin-film elements.

35. The circuit of claim 33 wherein the active circuit components are interconnected to form a plurality of circuit modules.

36. The circuit of claim 35 wherein the circuit modules are arranged in the two dimensions and stacked to form at least a portion of the stacked levels of all-metal circuit components.

37. The circuit of claim 33 wherein the plurality of circuit components art at least one of the levels comprises a plurality of memory cells, each memory cell comprising a multi-layer structure exhibiting magnetoresistance.

38. The circuit of claim 37 wherein each multi-layer structure comprises:
    a plurality of magnetic layers, at least one of the magnetic layers being for magnetically storing one bit of information;
    a plurality of the access lines integrated with the plurality of magnetic layers and configured such that the bits of information may be accessed using selected ones of the plurality of access lines and a magnetoresistive effect, and
    at least one keeper layer;
    wherein the magnetic layers, the access lines, and the at least one keeper layer form a substantially closed flux structure.

39. The circuit of claim 37 wherein the plurality of memory cells are arranged in a plurality of substantially identical and interchangeable memory array modules.

40. The circuit of claim 39 wherein the memory any modules are arranged in the two dimensions and stacked to form at least a portion of the stacked levels of all-metal circuit components.

41. The circuit of claim 37 wherein the plurality of the memory cells and the all-metal support electronics are arranged on separate ones of the stacked levels.

42. The circuit of claim 37 wherein the plurality of the memory cells and the all-metal support electronics are combined on selected ones of the stacked levels.

43. The circuit of claim 33 wherein the substrate comprises at least one of glass, a semiconductor, a metal, and a dielectric.

\* \* \* \* \*

UNITED STATES PATENT AND TRADEMARK OFFICE
CERTIFICATE OF CORRECTION

PATENT NO.        : 6,992,919 B2                                     Page 1 of 1
APPLICATION NO. : 10/731732
DATED             : January 31, 2006
INVENTOR(S)       : Andrei et al.

It is certified that error appears in the above-identified patent and that said Letters Patent is hereby corrected as shown below:

In line 3 of claim 9 (column 31, line 53) change "stacked wit" to --stacked with --.

In line 4 of claim 14 (column 32, line 7) delete "giant" after "exhibiting".

In line 4 of claim 17 (column 32, line 24) change "frat" to --first--.

In line 16 of claim 23 (column 33, line 12) change "electrodes" to --electronics--.

In line 24 of claim 23 (column 33, line 20) change "tin-film" to --thin-film--.

In line 4 of claim 27 (column 33, line 48) change "modifies" to --modules--.

In line 1 of claim 28 (column 33, line 50) change "memory ray" to --memory array--.

In line 2 of claim 37 (column 34, line 30) change "components art" to --components on--.

In line 1 of claim 40 (column 34, line 2) change "memory any" to --memory array--.

Signed and Sealed this

Third Day of October, 2006

JON W. DUDAS
*Director of the United States Patent and Trademark Office*